(12) United States Patent
Cho

(10) Patent No.: US 8,384,424 B2
(45) Date of Patent: Feb. 26, 2013

(54) REAL TIME AVERAGED IMPEDANCE CALIBRATION FOR ON-DIE TERMINATION

(75) Inventor: Junho J. H. Cho, Thornhill (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/083,264

(22) Filed: Apr. 8, 2011

(65) Prior Publication Data

US 2012/0256654 A1  Oct. 11, 2012

(51) Int. Cl.
*H03K 17/16* (2006.01)

(52) U.S. Cl. .......................................... 326/30

(58) Field of Classification Search ....................... 326/30
See application file for complete search history.

(56) References Cited

U.S. PATENT DOCUMENTS

| | | | |
|---|---|---|---|
| 6,064,224 A | 5/2000 | Esch, Jr. et al. | |
| 6,418,500 B1 * | 7/2002 | Gai et al. ...................... | 710/305 |
| 6,509,780 B1 | 1/2003 | Lim et al. | |
| 6,833,729 B2 | 12/2004 | Kim et al. | |
| 7,218,155 B1 | 5/2007 | Chang et al. | |
| 7,221,193 B1 | 5/2007 | Wang et al. | |
| 7,692,446 B2 * | 4/2010 | Lee et al. ......................... | 326/30 |
| 7,741,868 B2 * | 6/2010 | Nguyen et al. ................... | 326/30 |
| 7,986,161 B2 * | 7/2011 | Lee et al. ......................... | 326/30 |
| 2007/0085562 A1 * | 4/2007 | Nguyen et al. ................... | 326/30 |
| 2008/0211534 A1 * | 9/2008 | Jeong et al. ...................... | 326/30 |
| 2010/0060316 A1 * | 3/2010 | Kim et al. ........................ | 326/30 |
| 2011/0291699 A1 * | 12/2011 | Cho ................................ | 326/30 |
| 2012/0092039 A1 * | 4/2012 | Lee ................................. | 326/30 |

OTHER PUBLICATIONS

RAMBUS, "Output Driver Calibration," downloaded Jan. 3, 2011, 3 pages, URL: <http://www.rambus.com/in/technology/innovations/detail/output_driver.html>.
RAMBUS, "On Die Termination (ODT) Calibration," downloaded Jan. 3, 2011, 4 pages, URL: <http://www.rambus.com/in/technology/innovations/detail/odt_calib.html>.

* cited by examiner

*Primary Examiner* — Thienvu Tran
(74) *Attorney, Agent, or Firm* — Zagorin O'Brien Graham LLP

(57) ABSTRACT

An averaged impedance calibration is obtained by utilizing two separately controlled resistive loads arranged in parallel and choosing two adjacent control codes to configure switch arrays to set the resistance of each of the separate resistive loads. The resistance of the resistive loads is averaged to provide greater accuracy. The two adjacent control codes are close to the target impedance value and typically one is slightly higher and one is slightly lower than the target impedance value.

23 Claims, 24 Drawing Sheets

(a) $R_{initial} < R_{target}$        (b) $R_{initial} > R_{target}$

REAL TIME AVERAGED IMPEDANCE CALIBRATION FOR ON-DIE TERMINATION

BACKGROUND

1. Field of the Invention

This invention relates to data transmission and more particularly to on-die termination associated therewith.

2. Description of the Related Art

High-speed serial data transmission systems are being adopted to overcome limitations of data transmission rates of conventional parallel data transmission systems. Typically, a serial data transmission system utilizes a differential signal structure to increase noise immunity. In such a serial data interface, impedance calibration between a transmitter and a receiver is important. Without proper impedance matching between a transmitter and a receiver, levels of transmission and receiving signals can be distorted due to reflected waves, and as a result, the bit error rate of data transmission increases.

As the performance requirements of serial data transmission systems continue to increase, there are increasing requirements to deliver signal integrity that enables reliable operation at higher signaling rates. Signal line terminations are useful elements in the management of signal integrity and may be used external to the device or within the device itself. Incorporating a resistive termination within the device, which is often referred to as On-Die Termination (ODT), improves the signaling environment by reducing the electrical discontinuities introduced with off-die termination. Variations in the fabrication process as well as fluctuations in voltage and temperature result in variability in the resistive characteristics of the ODT elements.

FIG. 1 illustrates a block diagram of one approach for ODT calibration for pull-up termination. In the illustrated embodiment, ODT calibration block 100 includes the array of switches ($S_1$-$S_n$) and resistors ($R_1$-$R_n$), which are controlled by the feedback loop that includes N-bit decoder 101, up/down counter 103, comparator 105 and voltage reference 107. The N-bit decoder 101 generates the thermometer digital code ($D_{CNTL}$) from the binary N-bit output of the up/down counter 103 to set the resistance of the ODT array 111. Initially the N-bit output of the up/down counter is set to any value and increases or decreases depending on the value of $C_{OUT}$. Table 1 shows a truth table of an exemplary thermometer decoder. $D_{CNTL}[1:n]$ corresponds to $S_{[1:n]}$, which is a switch array. $D_{CNTL}[x]=0$ and 1 mean $S_x$ turns off and on, respectively. As the N-bit output of the up/down counter increases in value, the number of switches that are turned on increases. As the number of output bits increases, the number of switches that are controlled increases. For example, a 3-bit thermometer decoder generates 8 switch signals while a 5-bit thermometer decoder can generate signals for a 32 switch array.

FIG. 2 illustrates an ODT transfer curve, which shows the relationship of ODT resistance ($R_{ODT}$) and $D_{CNTL}$. As the $D_{CNTL}$ value increases, $R_{ODT}$ decreases because of the parallel configuration of the resistors. $R_{ODT}$ together with $R_{EX}$ 109 (an external precision off-chip resistor on the printed circuit board (PCB)), determines $V_{CAL}$. $V_{CAL}=VDD*R_{EX}/(R_{ODT}+R_{EX})$. If $V_{REF}$ can be generated accurately, then accurate $R_{ODT}$ can be approximated as $R_{EX}*(V_{DD}/V_{REF}-1)$ because $V_{CAL}$ approaches $V_{REF}$ through the feedback loop.

The comparison between $V_{CAL}$ and $V_{REF}$ is made in the comparator 105. The following describes the transfer function of comparator.

IF $V_{CAL}>V_{REF}$ THEN $C_{OUT}=$'high'
ELSE $C_{OUT}=$'low'

$V_{REF}$ is generated from voltage reference 107, which is a voltage divider using resistor string. FIG. 3 illustrates an example of a voltage reference. As long as the ratio of $R_A$ and $R_B$ in the voltage divider is accurate, the accuracy of $R_{ODT}$ depends on that of the external resistor off-chip $R_{EX}$. Typically, the accuracy of $R_{EX}$ is at least 5%.

The up/down counter 103 counts up or down depending on the $C_{OUT}$ state. The logic value 'high' and 'low' of $C_{OUT}$ makes the up/down counter count downward and upward, respectively. While $V_{CAL}<V_{REF}$, $C_{OUT}$ stays 'low' and the up/down counter counts upward. On the other hand, while $V_{CAL} \geq V_{REF}$, $C_{OUT}$ stays 'high' and the up/down counter counts down. Therefore, once the state of $C_{OUT}$ is changed, the up/down counter counts in the opposite direction at the next feedback operation and $C_{OUT}$ toggles. FIGS. 4a and 4b illustrate the calibration operation in the time domain. FIGS. 4a and 4b illustrate embodiments in which $R_{initial}$ (the initial value of $R_{ODT}$) is lower and higher than $R_{target}$, respectively, where $R_{target}=R_{EX}*(VDD/V_{REF}-1)$. If the state of $C_{OUT}$ is not changed until the up/down counter counts down to 0 or up to $2^N-1$, it means that $R_{ODT}$ is not able to achieve the target impedance with the proper accuracy.

Once $R_{ODT}$ reaches $R_{target}$, at time T1 it toggles between ($R_{target}-\Delta_1$) and ($R_{target}+\Delta_2$) because $C_{OUT}$ also toggles and the up/down counter counts in the opposite direction at the next feedback operation when the state of $C_{OUT}$ is changed. The value of ($\Delta_2-\Delta_1$) is defined as the resolution of $R_{ODT}$ and is determined by the number of array switches ($S_1$-$S_n$) and resistors ($R_1$-$R_n$). It means that the N-bit output of the up/down counter determines the resolution. As the number of bits (N) of the N-bit output increases, one can achieve a higher resolution of $R_{ODT}$ for calibration, but that requires more switches and resistive components. Thus, there is trade-off between resolution and area.

FIG. 5 depicts the block diagram of a differential TX (transmitter) with an impedance calibrated pull-up termination. Actual calibration occurs using ODT 501, which is coupled to $R_{EX}$ and a feedback loop. Identical ODTs 503 and 505 (or at least substantially identical, given possible process variations and temperature gradients) are used for the pull-up terminations at the transmission nodes 507 and 509 at the

TABLE 1

| N-bit (decimal) | $D_{CNTL}[1]$ | $D_{CNTL}[2]$ | $D_{CNTL}[3]$ | ... | $D_{CNTL}[2^{N-2}]$ | $D_{CNTL}[2^{N-1}]$ | $D_{CNTL}[2^N]$ |
|---|---|---|---|---|---|---|---|
| 0 | 1 | 0 | 0 | 0 | 0 | 0 | 0 |
| 1 | 1 | 1 | 0 | 0 | 0 | 0 | 0 |
| 2 | 1 | 1 | 1 | 0 | 0 | 0 | 0 |
| ... | ... | ... | ... | ... | ... | ... | ... |
| $2^N-3$ | 1 | 1 | 1 | 1 | 1 | 0 | 0 |
| $2^N-2$ | 1 | 1 | 1 | 1 | 1 | 1 | 0 |
| $2^N-1$ | 1 | 1 | 1 | 1 | 1 | 1 | 1 | output of the transmitter 511. $D_{CNTL}$ is generated through the calibration feedback loop and feeds the switch arrays on the TX pull-up terminations.

FIG. 6 shows the application impedance calibrated pull-up termination for a receiver (RX). The same calibration concept as shown in FIG. 5 can be used at the transmission nodes 601 and 603 at the input of the receiver RX 605.

The same idea can be used for the impedance calibrated pull-down termination. FIG. 7 and FIG. 8 show TX and RX with impedance calibrated pull-down termination, respectively. The differences from pull-up termination configuration are $R_{EX}$ is connected to VDD and switches are connected to GND.

SUMMARY OF EMBODIMENTS OF THE INVENTION

Improvements in on-die termination can lead to greater accuracy, smaller area utilized, and less toggling. Embodiments of the invention provide an impedance calibration technique for on-die termination (ODT) with better accuracy than prior approaches without increasing resolution by utilizing an averaging impedance technique.

In one embodiment, a method is provided for a calibrated termination impedance that includes supplying first and second control signals having different values to configure respectively first and second switch arrays and associated first and second resistive loads coupled in parallel. Each of the resistive loads has their respective resistance values determined by configuration of the switch arrays. The first control signals cause the first resistive load to have a first resistance value and the second control signals cause the second resistive load to have a second resistance value that differs from the first resistance value. In embodiments, the first control signals set the first resistance value above a target impedance value and the second control signals set the second resistive value below the target impedance value.

In another embodiment of the invention, an apparatus for on-die termination resistance includes a first and second plurality of resistors capable of being coupled in parallel between a first power supply node and a transmission node. A first and second plurality of switches are coupled between the power supply node and the transmission node. The first plurality of switches selectively configures a first resistance from the first plurality of resistors and the second plurality of switches selectively configures a second resistance from the second plurality of resistors. The combination of the first and second resistances form a third resistance providing the on-die termination resistance. A control circuit supplies first control signals to the first plurality of switches to select the first resistance and supplies second control signals to the second plurality of switches to select the second resistance. The first and second resistances are typically selected to be respectively above and below a target resistance.

BRIEF DESCRIPTION OF THE DRAWINGS

The present invention may be better understood, and its numerous objects, features, and advantages made apparent to those skilled in the art by referencing the accompanying drawings.

Note that the use of the same reference symbols in different drawings indicates similar or identical items.

DETAILED DESCRIPTION

In various embodiments of the invention, averaged impedance calibration is obtained by utilizing two separately controlled resistive loads arranged in parallel and choosing two adjacent control codes to configure switch arrays to set the resistance of each of the separate resistive loads. The resistance of the resistive loads is averaged to provide greater accuracy. The two adjacent control codes are close to the target impedance value and typically one is slightly higher and one is slightly lower than the target impedance value. Real-time averaged impedance calibration for on-die termination achieves higher impedance accuracy than prior approaches without increasing bits of a thermometer decoder. Alternative embodiments provide the equivalent resolution to earlier approaches with fewer bits of thermometer decoder and can reduce the area for ODT. Moreover, various embodiments of the invention avoid the toggle behavior of termination impedance during the calibration which is found in earlier impedance calibration approaches. The toggle behavior of termination impedance may cause signal distortions because of glitches and reflections in TX or RX during the calibration. Note that certain embodiments can re-use digital-related calibration blocks such as thermometer decoder, up/down counter, comparator and voltage reference without modifications.

Figure 9:
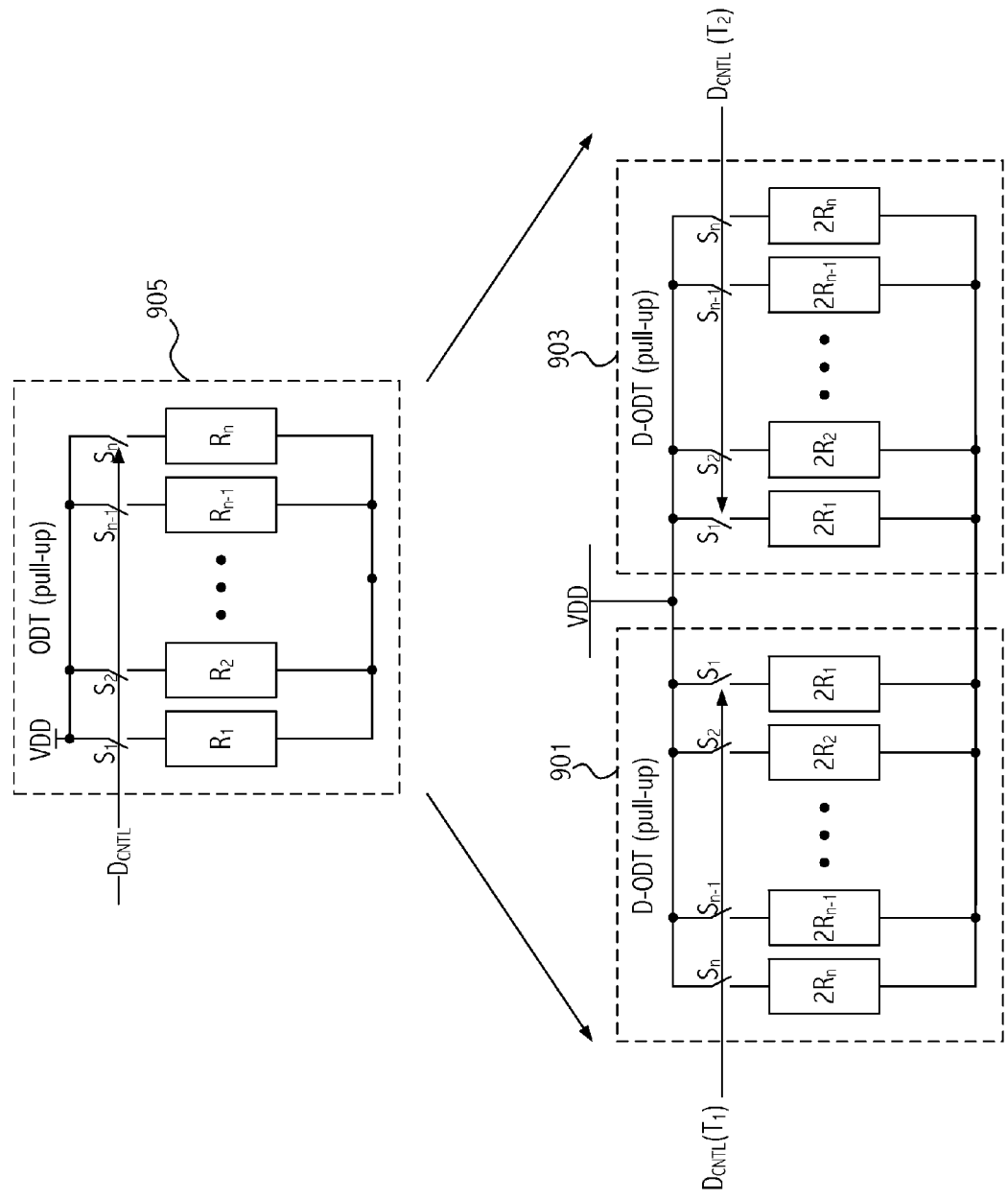
FIG. 9 illustrates differences between a previous approach to ODT and an exemplary embodiment.

Referring to FIG. 9, an exemplary embodiment is illustrated showing the differences between a previous approach to ODT and an exemplary embodiment. FIG. 9 shows the block diagram of a pull-up ODT embodiment that includes separately controlled resistive loads 901 and 903. In the illustrated embodiment, the resistive loads 901 and 903 are substantially identical, as are the switch arrays $S_1$ to $S_n$, given limitations of such factors as process variations and temperature gradients. However, separate control signals, $D_{CNTL}(T_1)$ and $D_{CNTL}(T_2)$ are provided to control the configuration of the resistive arrays 901 and 903. A previous ODT approach is shown at 905. In the embodiment illustrated in FIG. 9, each resistive component of blocks 901 and 903 is double the resistance of the resistive components of ODT block 905 and thus, each block is referred to herein as D-ODT. If $D_{CNTL}(T_1)$ and $D_{CNTL}(T_2)$ are identical, then the total resistance of two D-ODTs in parallel is equivalent to the previous single ODT 905.

Figure 1:
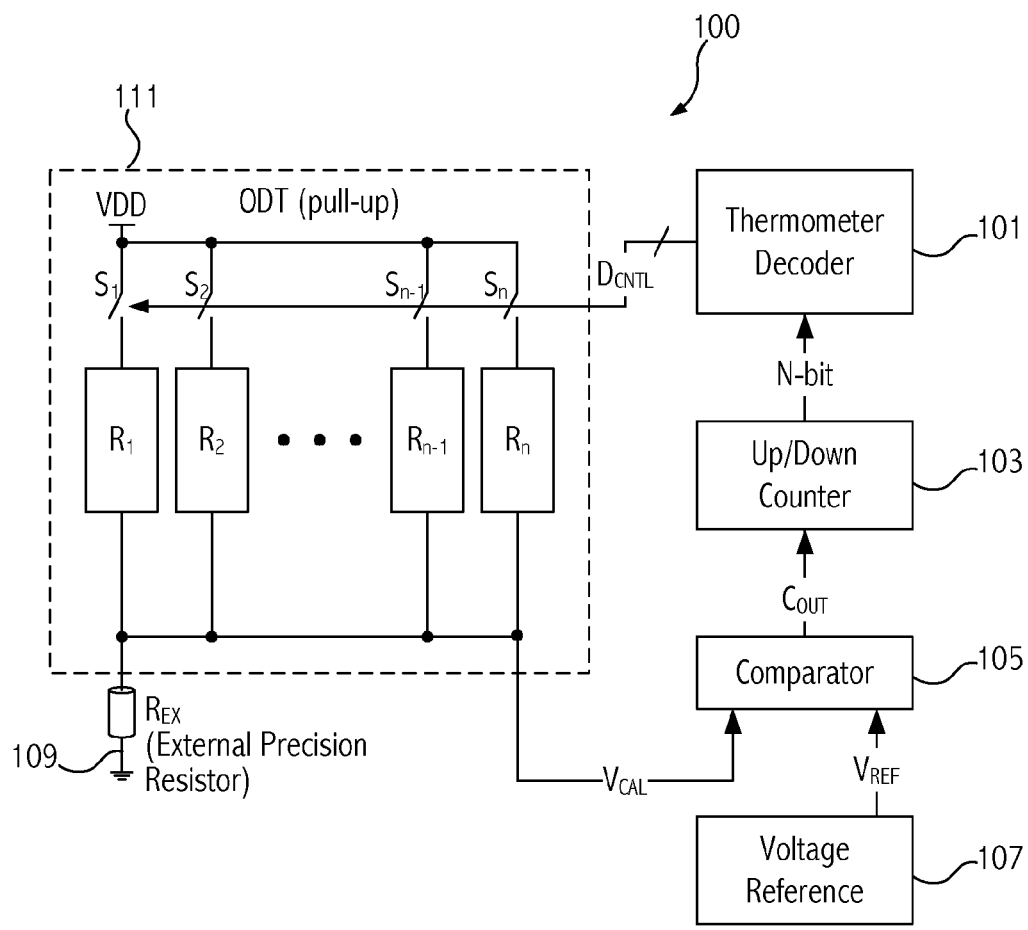
FIG. 1 illustrates a block diagram of one approach for ODT calibration for pull-up termination.
Figure 2:
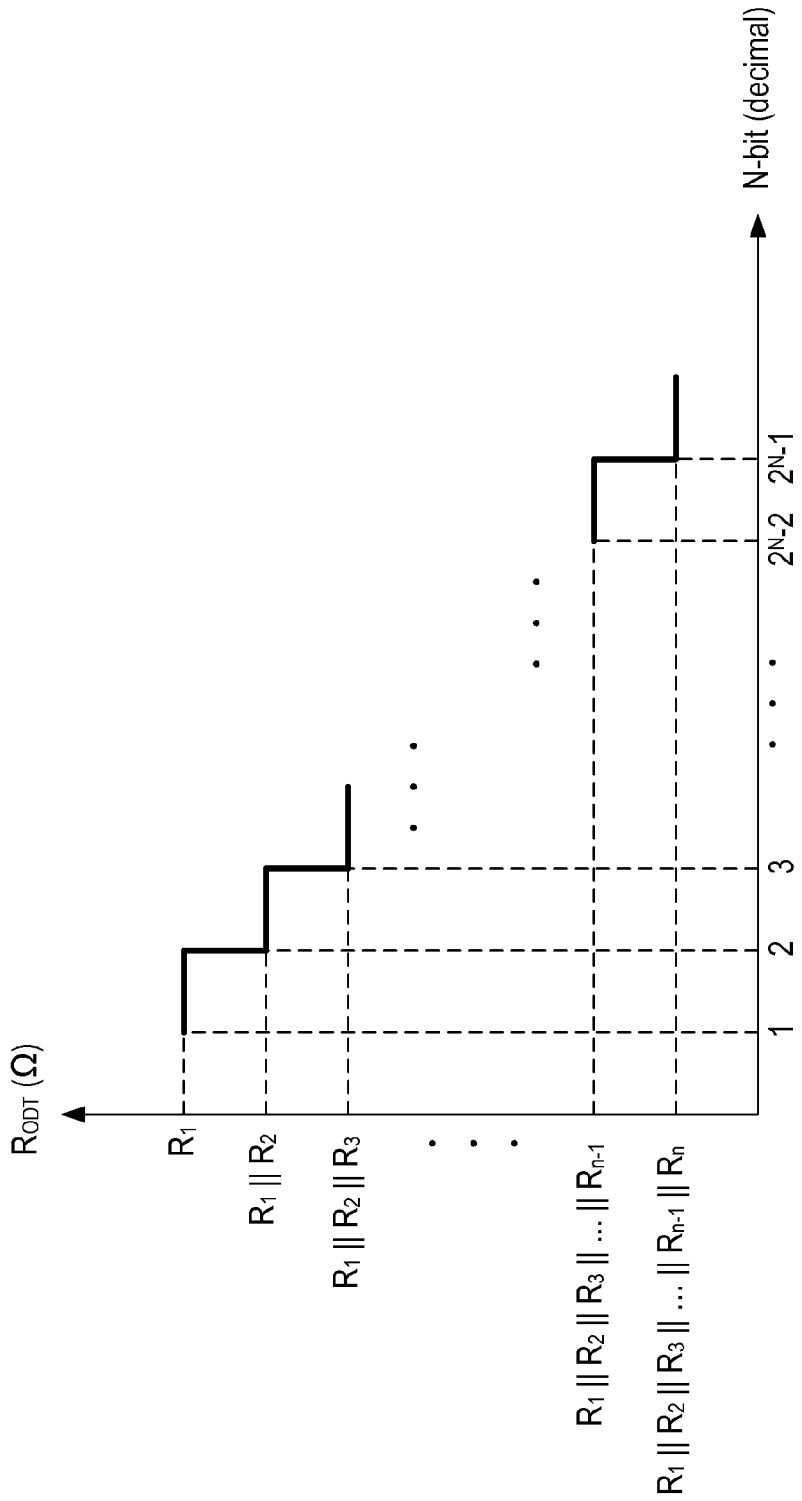
FIG. 2 illustrates an ODT transfer curve.
Figure 3:
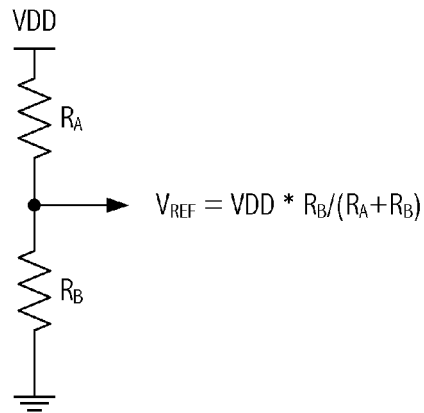
FIG. 3 illustrates an example of a voltage reference circuit.
Figures 4A, 4B:
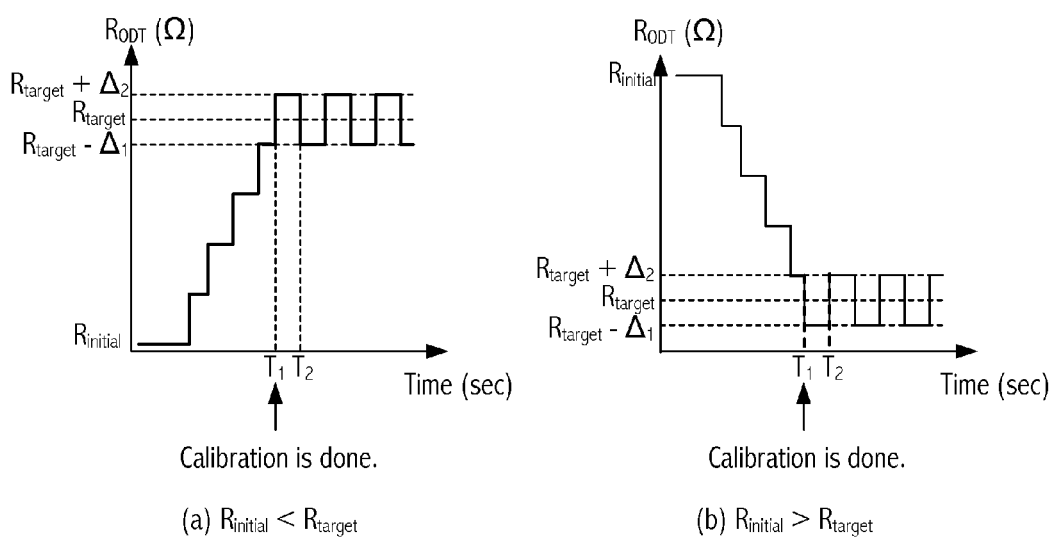
FIG. 4a illustrates the calibration operation in the time domain.
FIG. 4b illustrates the calibration operation in the time domain.
Figure 5:
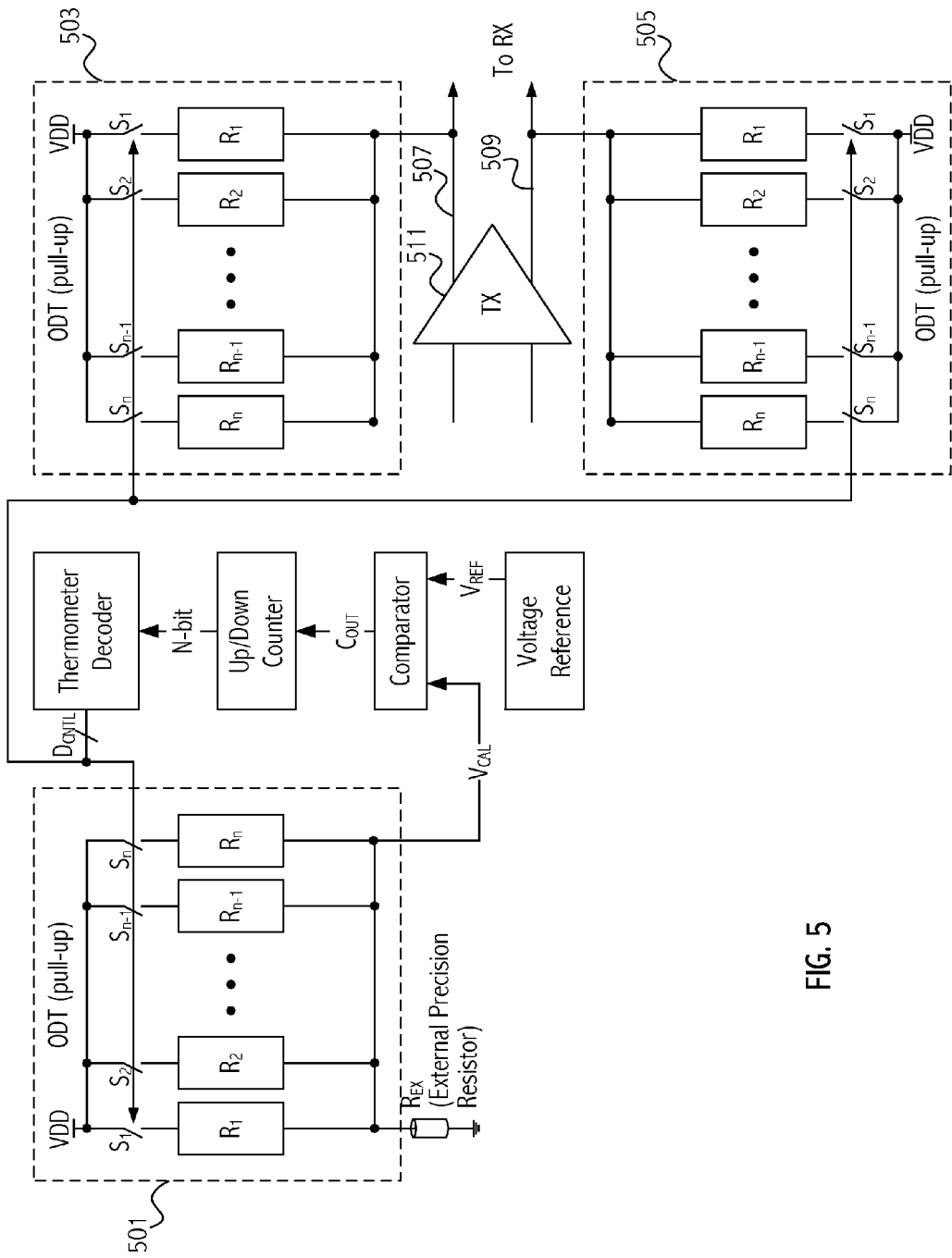
FIG. 5 illustrates a block diagram of a differential TX (transmitter) with an impedance calibrated pull-up termination.
Figure 6:
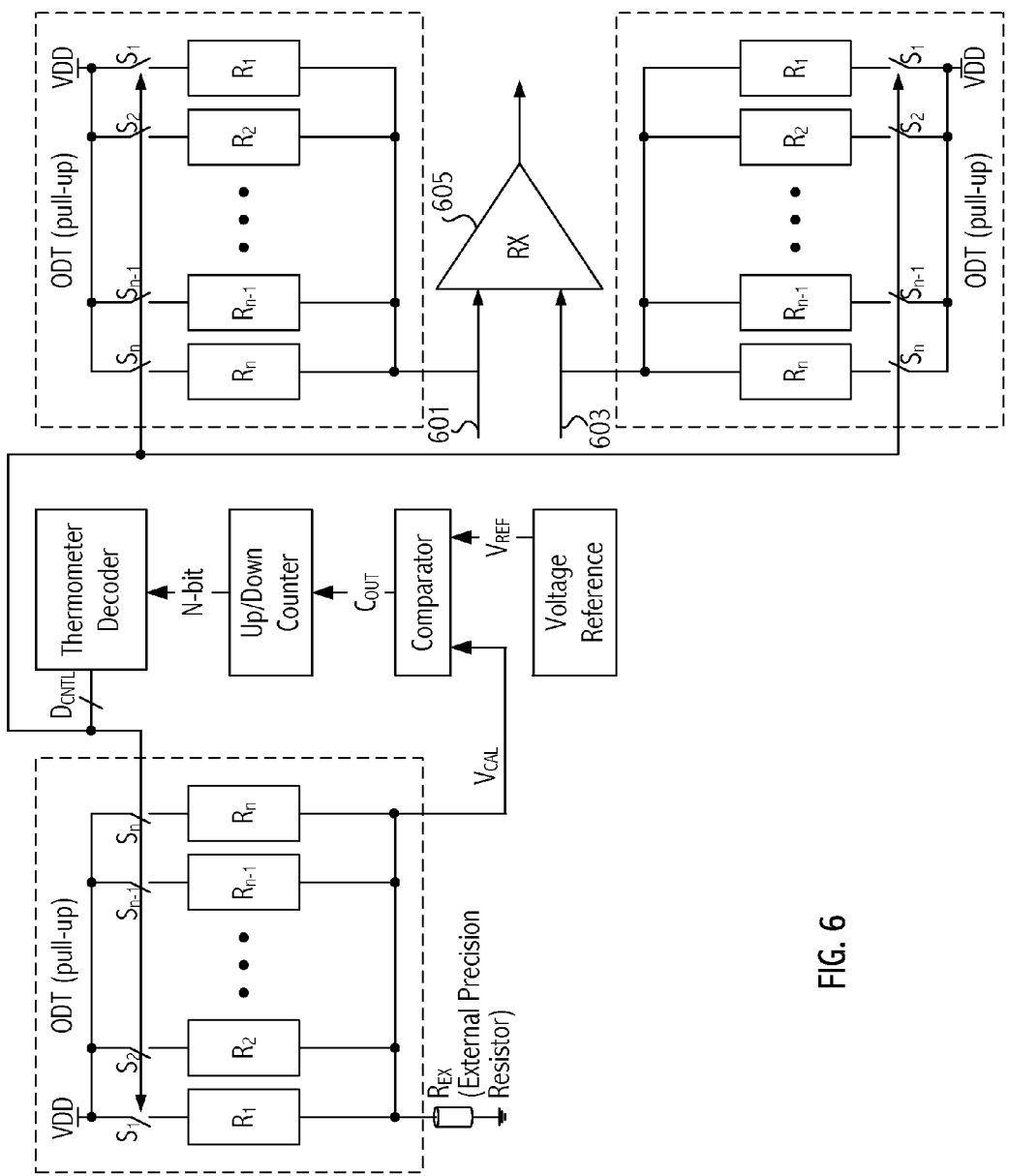
FIG. 6 illustrates impedance calibrated pull-up termination for a receiver (RX).
Figure 7:
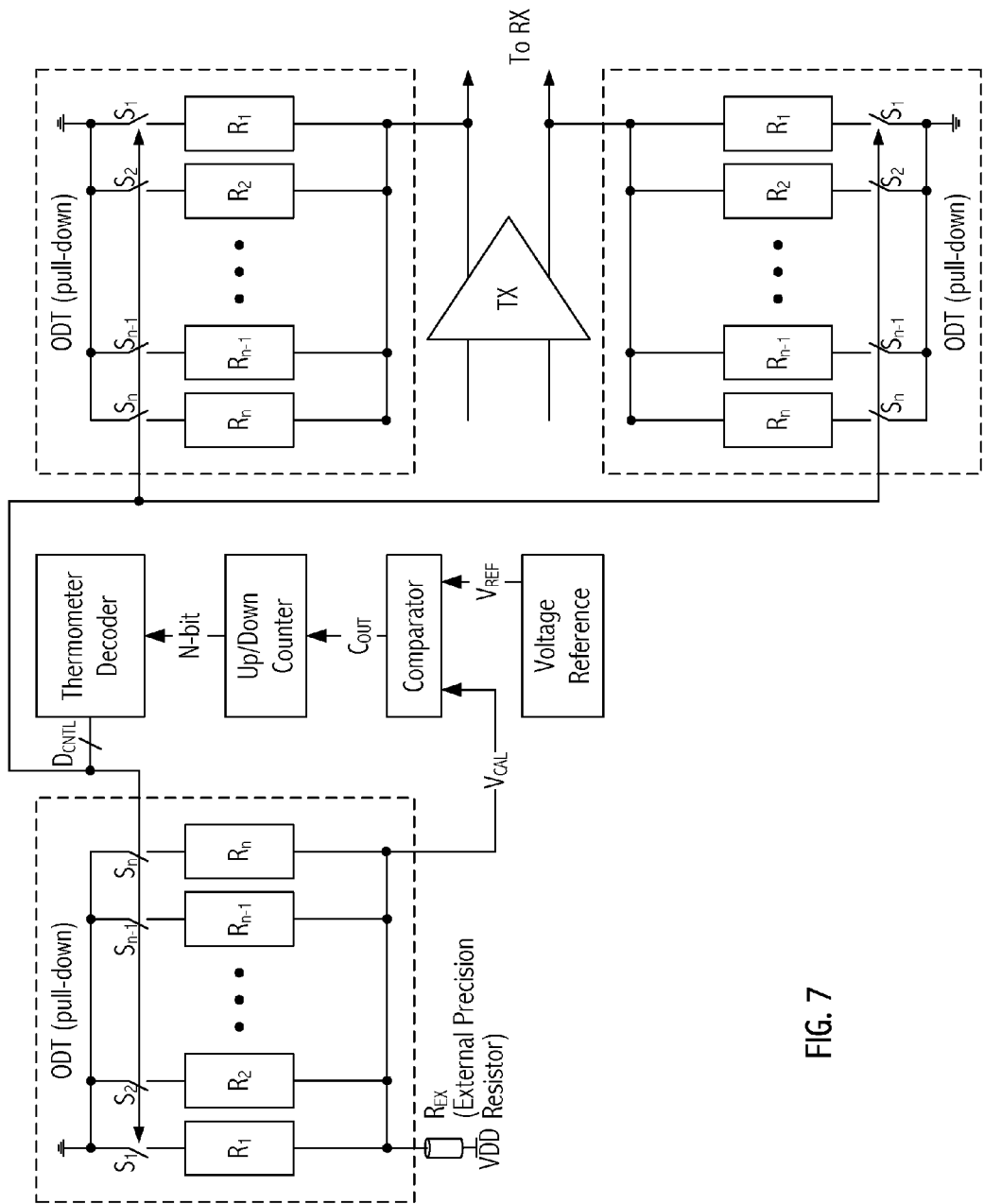
FIG. 7 shows a transmitter (TX) with impedance calibrated pull-down termination.
Figure 8:
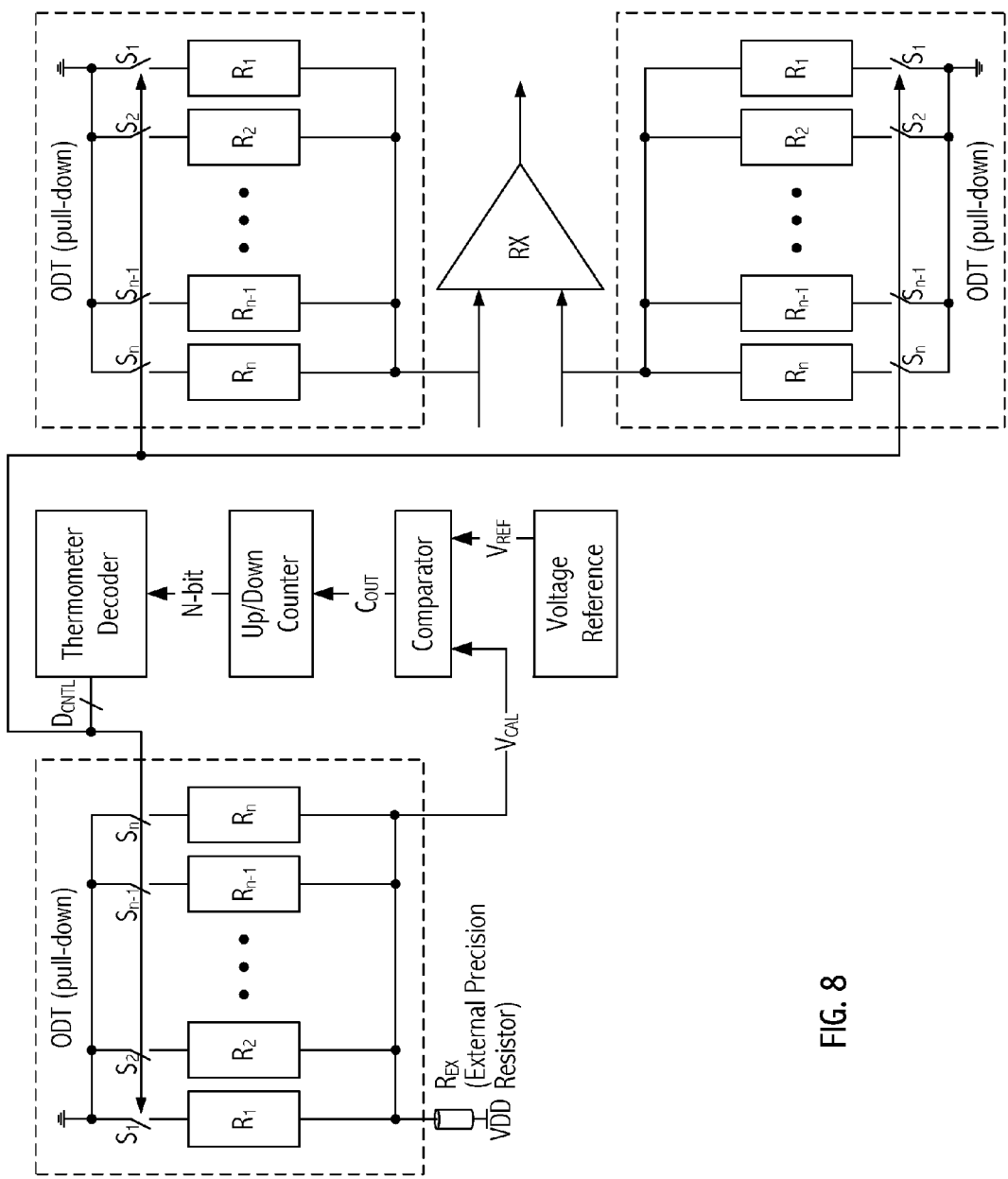
FIG. 8 shows a receiver (RX) with impedance calibrated pull-down termination.
Figure 10:
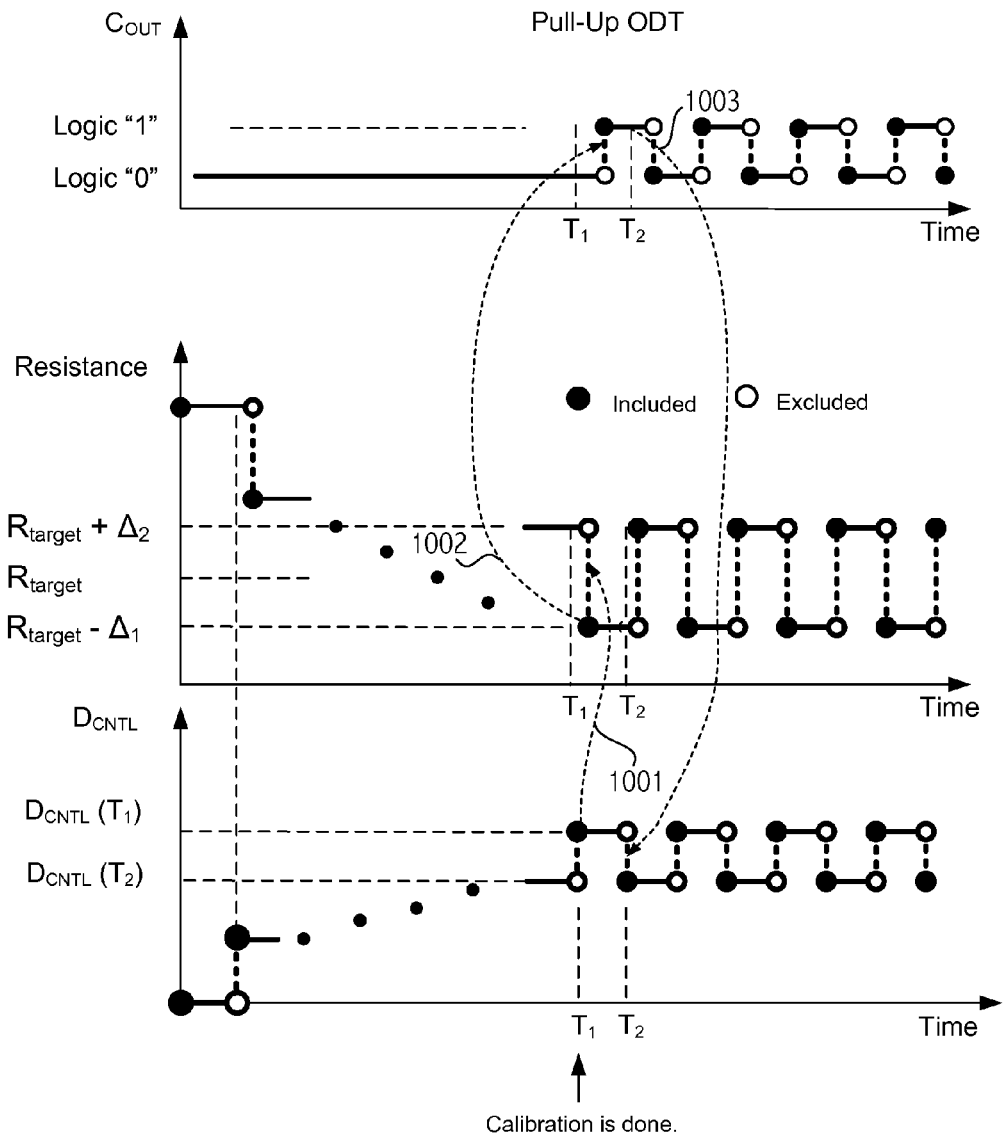
FIG. 10 illustrates curves of the output of the comparator, a $D_{CNTL}$ and the resistance of the single ODT block 905 of FIG. 9 during calibration.

FIG. 10 depicts the output of the comparator $C_{out}$, the resistance curve of ODT block 905 and $D_{CNTL}$. The curves include time delay. The arrows 1001, 1002, and 1003 help explain the operation of the various blocks whose curves are illustrated. It is assumed that the initial value of $D_{CNTL}$ is 0 decimal. Of course an initial value of 0 is exemplary as any value of $D_{CNTL}$ can be used. Calibration is complete at $T_1$ when $D_{CNTL}$ switches from $D_{CNTL}(T_2)$ to $D_{CNTL}(T_1)$. As shown by arrow 1001, $D_{CNTL}(T_1)$ causes the resistance of block 905 to switch to $R_{target}-\Delta_1$ (with a time delay from $T_1$). Then, as illustrated by 1002, $R_{target}-\Delta_1$ causes the comparator output $C_{out}$='1' (after another time delay) due to $V_{CAL}$ (see FIG. 8) becoming greater than $V_{REF}$. Next, as arrow 1003 depicts, $C_{out}$=1, causes the counter (see counter 103 in FIG. 1) to count down at $T_2$. As can be seen in FIG. 9, after the impedance of the ODT resistance crosses $R_{target}$ beginning at $T_1$ plus a time delay, $D_{CNTL}$ toggles between $D_{CNTL}(T_1)$ and $D_{CNTL}(T_2)$ and the ODT block toggles between $(R_{target}-\Delta_1)$ and $(R_{target}+\Delta_2)$. Assuming $\Delta_1=\Delta_2=\Delta=R_{target}/2^N$, the accuracy error of the calibrated single ODT 905 is $\pm 1/2^N$, where N is the number of input bits to the thermometer decoder. In order to decrease the error of the calibrated termination resistance, N can be increased. However, that increases the number of switches and resistive components in the ODT block exponentially. On the other hand, the accuracy error of the ODT block shown in FIG. 9 with two resistive loads in blocks 901 and 903 is reduced to $-1/2^{2N}$ when $\Delta_1=\Delta_2=\Delta=R_{target}/2^N$.

Figure 11:
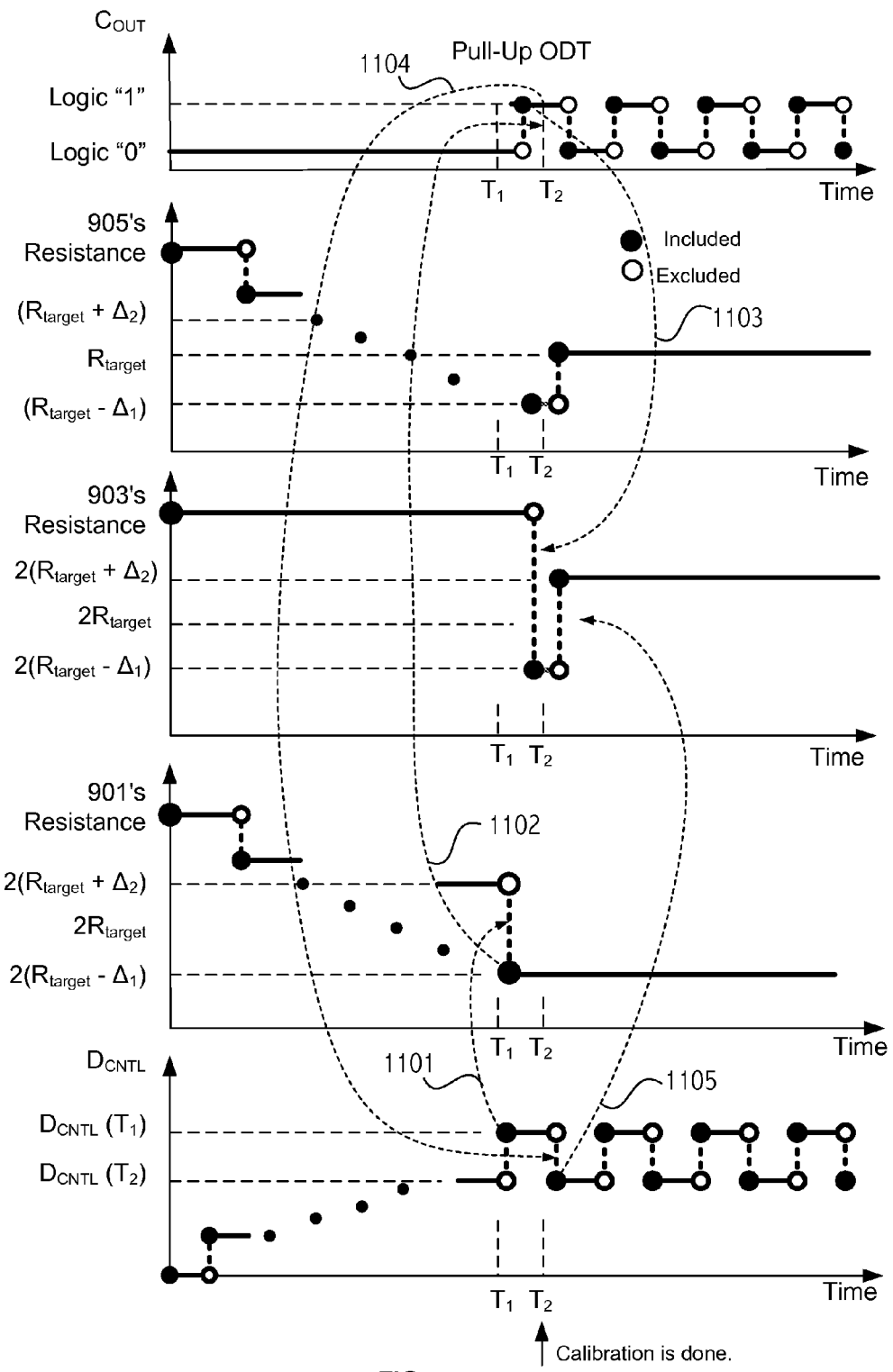
FIG. 11 illustrates the resistance curves of the resistance blocks of FIG. 9 during calibration.
Figure 12:
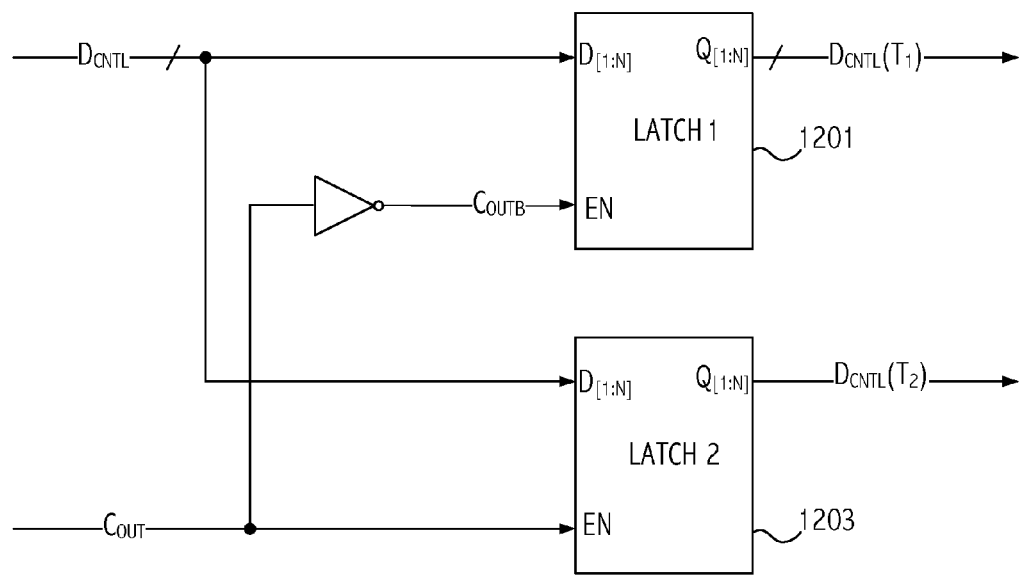
FIG. 12 illustrates the generation of $D_{CNTL}(T_1)$ and $D_{CNTL}(T_2)$ from $D_{CNTL}$ during calibration according to an embodiment.

The resistances curves of blocks 901, 903 and 905 (FIG. 9) are drawn separately and include time delay to help understand the benefit of the averaging technique described herein. Note that the target resistances of the individual blocks 901 and 903 are $2R_{target}$ while 905's target resistance is $R_{target}$. The operation flow is explained by way of the arrows. FIG. 12 illustrates the generation of the control signals $D_{CNTL}(T_1)$ and $D_{CNTL}(T_2)$ from $D_{CNTL}$ during calibration according to an embodiment. In the illustrated embodiment, LATCH1 1201 and LATCH2 1203 are identical and have $D_{CNTL}$ as an input. The comparator output, $C_{OUT}$ and its inverted output, $C_{OUTB}$ enable LATCH2 and LATCH1, respectively. When calibration is done, the state of $C_{OUT}$ changes either from logic 'low' to 'high' or from logic 'high' to 'low' and keeps toggling between 'low' and 'high' as depicted in FIG. 11 based on the comparison of either $D_{CNTL}(T_1)$ or $D_{CNTL}(T_2)$ to the target resistance ($R_{target}$). Note that $D_{CNTL}$ may be generated by calibration control logic 1720 shown in FIG. 17 using split D-ODT blocks for calibration as shown, e.g., in FIG. 17, or may use a non-split ODT block for calibration.

Note that as $D_{CNTL}$ increases, 901's resistance decreases and 903's resistance keeps its initial value due to the operation of the latches 1201 and 1203. The comparator output $C_{out}$ is logic '0' from time T=0 to $T_1$. That holds block 903's resistance to the initial value through latch 1203, since latch 1203 is not enabled even though $D_{CNTL}$ increases whereas 901's resistance decreases during T=0 to $T_1$ because latch 1201 passes its input to output since latch 1201 is enabled.

As illustrated by arrow 1101, when $D_{CNTL}$ achieves the value $D_{CNTL}(T_1)$ at $T=T_1$, 901's resistance changes to $2(R_{target}-\Delta_1)$ with a time delay because $C_{out}$ is at 0 at $T=T_1$ and latch 1201 passes its input to output. Then as arrow 1102 depicts, the reduced resistance on 905 in FIG. 10 makes $C_{out}$=high with another time delay. Arrow 1102 may be more accurately represented by arrow 1002 in FIG. 10 if $C_{out}$ is based on a non-split ODT such as 905. And then as arrow 1103 shows, a high value of $C_{out}$ makes 903's resistance to be $2(R_{target}-\Delta_1)$ because latch 1203 in FIG. 12 passes its input to output. And then as arrow 1104 shows, a high $C_{out}$ causes the counter to count down from $D_{CNTL}(T_1)$ to $D_{CNTL}(T_2)$. That makes block 903's resistance increase to $2(R_{target}+\Delta_2)$ at 1105. The resistance of 901 and 903 will be held by virtue of 1201 and 1203 latches by enabled by the toggling $C_{out}$. The total resistance is calculated from the parallel connection of 901 and 903, and its value will be closer to $R_{target}$ because of averaging mechanism than in previous ODT implementations.

Thus, the two D-ODT blocks configured in parallel have separate $D_{CNTL}$ signals providing two adjacent codes, $D_{CNTL}(T_1)$ and $D_{CNTL}(T_2)$, which correspond to the resistance, $2(R_{target}-\Delta_1)$ and $2(R_{target}+\Delta_2)$, respectively. Assuming $\Delta_1=\Delta_2=\Delta=R_{target}/2N$, the total impedance of the two D-ODT blocks 901 and 903 in parallel is $R(1-1/2^{2N})$ and its accuracy error becomes $-1/2^{2N}$. Depending on a particular implementation, $D_{CNTL}(T_1)$ and $D_{CNTL}(T_2)$, can be any value during calibration but will go to the correct values once the comparator output starts toggling.

Compared to the ODT block 905 with a single resistive block and only one control $D_{CNTL}$ that toggles between $D_{CNTL}(T_1)$ and $D_{CNTL}(T_2)$, the split ODT with two resistive blocks and two different control signals has much higher accuracy. As N (the number of bits supplied to the thermometer encoder) increases, the accuracy of the split ODT increases exponentially. Table 2 provides an accuracy comparison between the conventional ODT 905 and the split ODT with blocks 901 and 903 for different values of N when $\Delta_1=\Delta_2=\Delta=R_{target}/2^N$.

TABLE 2

| N | Error of the single ODT | Error of split ODT |
|---|---|---|
| 1 | −50.000%-50.000% | −25.000% |
| 2 | −25.000%-25.000% | −6.250% |
| 3 | −12.500%-12.500% | −1.563% |
| 4 | −6.250%-6.250% | −0.391% |
| 5 | −3.125%-3.125% | −0.098% |
| 6 | −1.563%-1.563% | −0.024% |
| 7 | −0.781%-0.781% | −0.006% |
| 8 | −0.391%-0.391% | −0.002% |

In general, it is rare to have $\Delta_1=\Delta_2$ because of variations in process, power supply and temperature. Assuming $\Delta_1+\Delta_2=2\Delta$, as the difference between $\Delta_1$ and $\Delta_2$ increases, the accuracy decreases. Actually, the worst-case error can be obtained when one of $\Delta_1$ and $\Delta_2$ becomes $2\Delta$. But, the split ODT with two independently controlled resistive blocks still provides better accuracy than the single ODT block in the worst case scenarios.

The worst case accuracy error is obtained when $\Delta_1$ is much bigger than $\Delta_2$ ($\Delta_1 \gg \Delta_2$ and $\Delta_1+\Delta_2=2\Delta$). If $\Delta_1 \gg \Delta_2$, then as $\Delta_1$ approaches $2\Delta$, $\Delta_2$ can be ignored and treated as 0. In this extreme case, the error of the single ODT and the split ODT are $-1/(2^{N-1})$ and $-1/(2^N-1)$, respectively. Table 3 shows the accuracy error comparison between the single ODT and split ODT with the different Ns when $\Delta_1 \gg \Delta_2$ and $\Delta_1+\Delta_2=2\Delta$.

TABLE 3

| N | Error of previous ODT | Error of split ODT |
|---|---|---|
| 1 | −100.00% | −100.00% |
| 2 | −50.00% | −33.33% |
| 3 | −25.00% | −14.29% |
| 4 | −12.50% | −6.67% |
| 5 | −6.25% | −3.23% |
| 6 | −3.13% | −1.59% |
| 7 | −1.56% | −0.79% |
| 8 | −0.78% | −0.39% |

Similarly, if $\Delta_2$ is much bigger than $\Delta_1$ ($\Delta_2 \gg \Delta_1$), then as $\Delta_2$ approaches $2\Delta$, $\Delta_1$ approaches 0 and can be ignored. In this extreme case, the error of the single ODT block and the split ODT blocks are $1/(2^{N-1})$ and $-1/(2^N+1)$, respectively. Table 4 shows the accuracy comparison between the single ODT block and split ODT blocks for different values of N, when $\Delta_1 \ll \Delta_2$ and $\Delta_1+\Delta_2=2\Delta$.

TABLE 4

| N | Error of single ODT | Error of split ODT |
|---|---|---|
| 1 | 100.00% | −33.33% |
| 2 | 50.00% | −20.00% |
| 3 | 25.00% | −11.11% |
| 4 | 12.50% | −5.88% |
| 5 | 6.25% | −3.03% |
| 6 | 3.13% | −1.54% |
| 7 | 1.56% | −0.78% |
| 8 | 0.78% | −0.39% |

Figure 13:
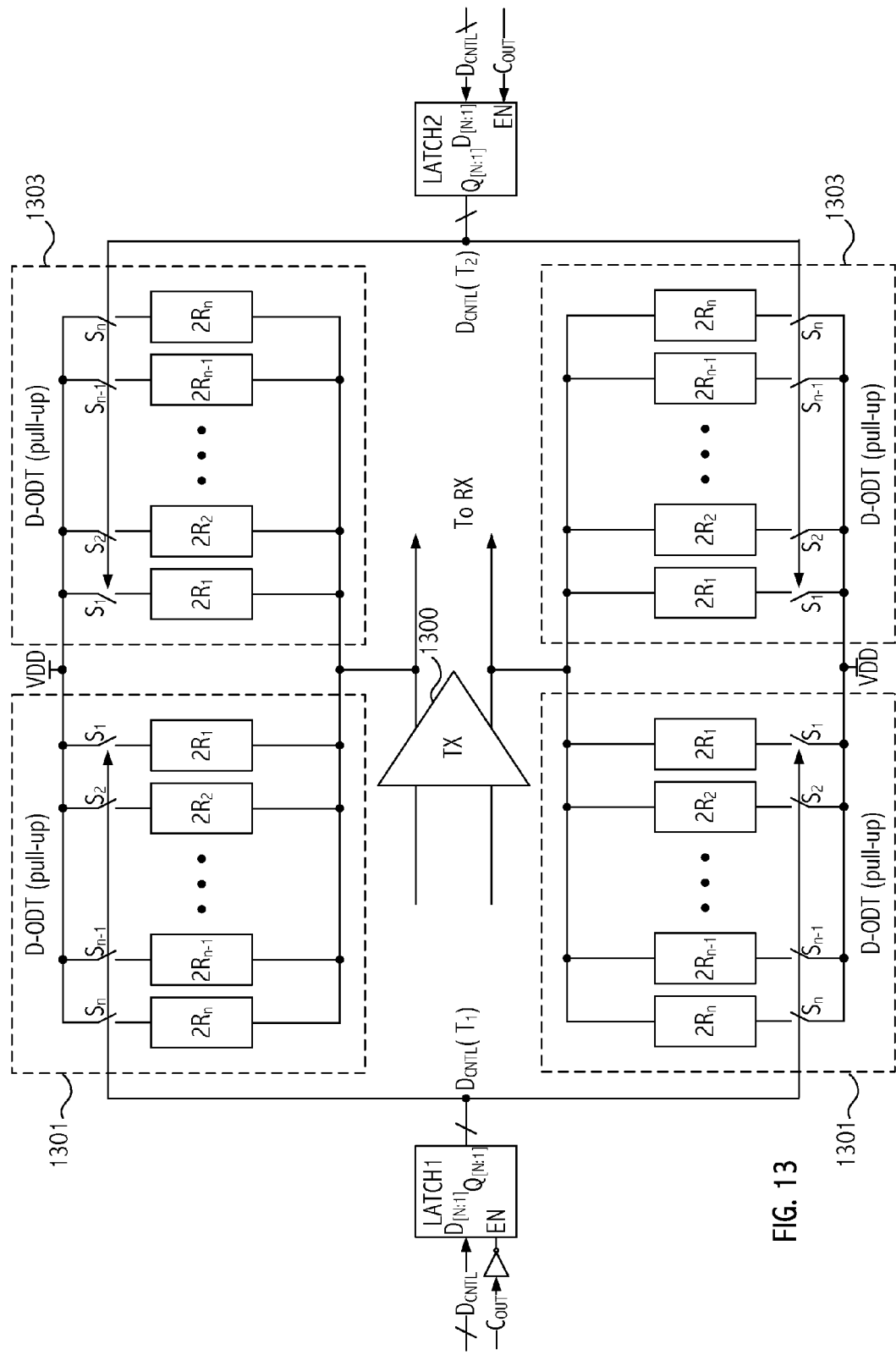
FIG. 13 illustrates an exemplary block diagram of a differential transmitter (TX) utilizing split impedance calibrated pull-up termination according to an embodiment of the invention.

Thus, splitting the ODT block into multiple pieces with separate and adjacent codes controlling the resistance provides better accuracy for both normal and extreme cases of $\Delta_1$ and $\Delta_2$. FIG. 13 illustrates an exemplary block diagram of a differential transmitter (TX) 1300 utilizing split impedance calibrated pull-up termination according to an embodiment of the invention. The illustrated split ODT includes two resistive blocks 1301 and 1303 under separate control ($D_{CNTL}(T_1)$ and $D_{CNTL}(T_2)$), respectively, for each leg of the differential transmitter 1300.

Figure 14:
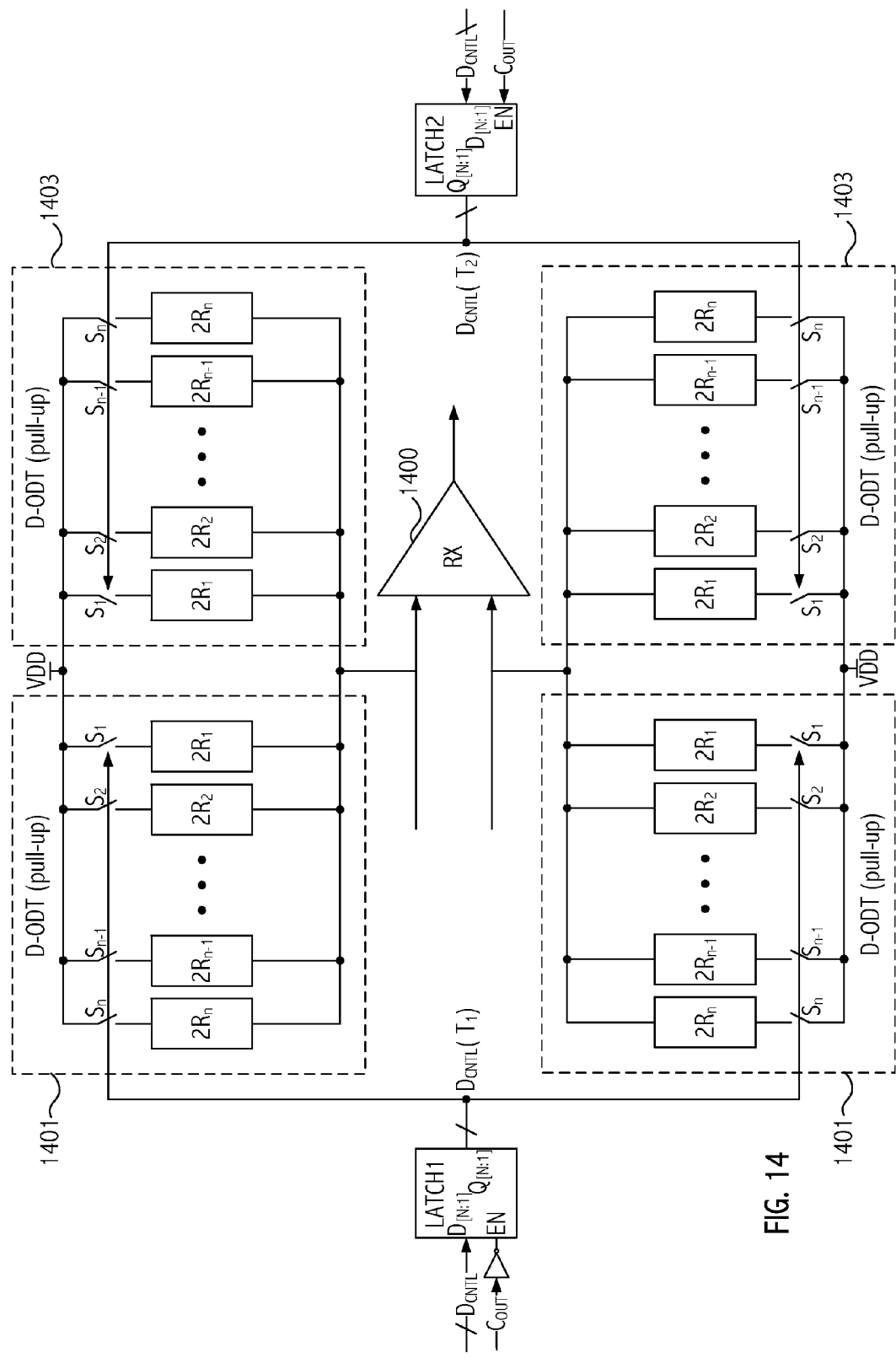
FIG. 14 illustrates an exemplary block diagram of receiver (RX) utilizing split impedance calibrated pull-up termination according to an embodiment of the invention.

FIG. 14 illustrates an exemplary block diagram of receiver (RX) 1400 utilizing split impedance calibrated pull-up termination according to an embodiment of the invention. In the illustrated embodiment, the split ODT concept is applied for pull-up termination of a receiver. The illustrated split ODT includes two resistive blocks 1401 and 1403 under separate control ($D_{CNTL}(T_1)$ and $D_{CNTL}(T_2)$), respectively, for each leg of the differential receiver 1400.

Figure 15:
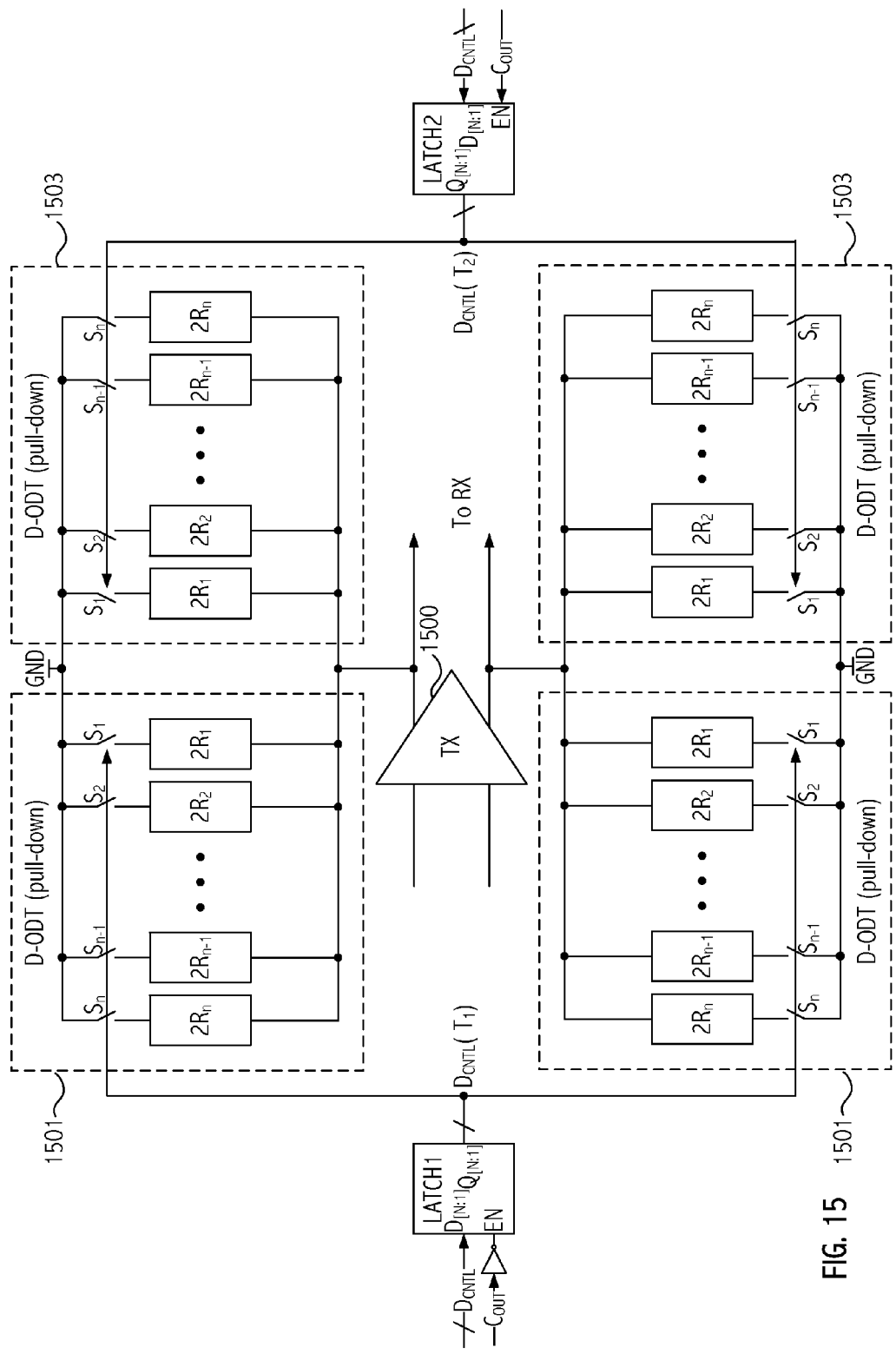
FIG. 15 illustrates an exemplary block diagram of a TX (transmitter) utilizing split impedance calibrated pull-down termination according to an embodiment of the invention.

FIG. 15 illustrates an exemplary block diagram of TX (transmitter) 1500 utilizing split impedance calibrated pull-down termination according to an embodiment of the invention. The illustrated split ODT includes two resistive blocks 1501 and 1503 under separate control ($D_{CNTL}(T_1)$ and $D_{CNTL}(T_2)$), respectively, for each leg of the differential receiver 1500.

Figure 16:
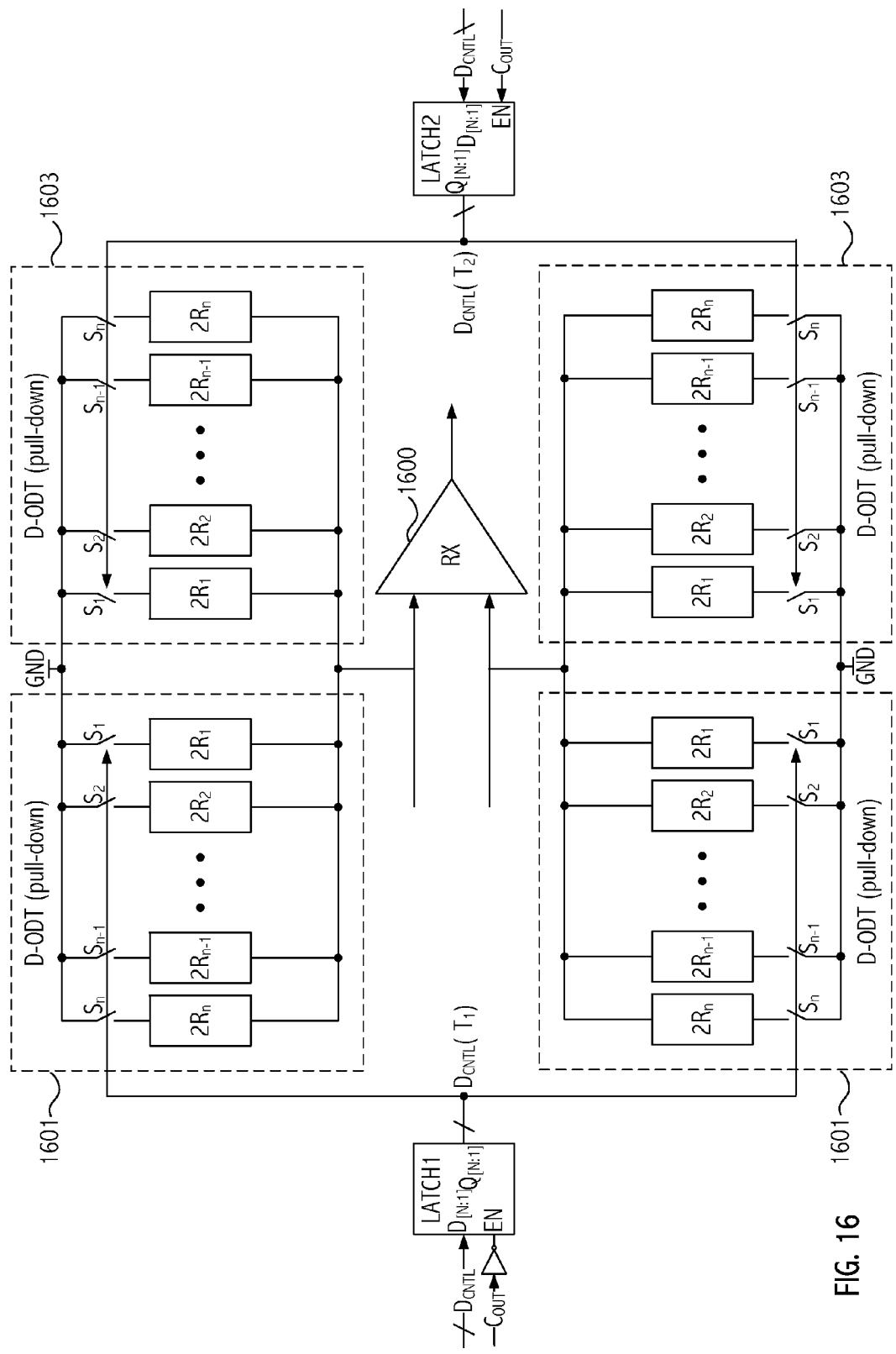
FIG. 16 illustrates an exemplary block diagram of an RX (receiver) utilizing split impedance calibrated pull-down termination according to an embodiment of the invention.

FIG. 16 illustrates an exemplary block diagram of RX (receiver) 1600 utilizing split impedance calibrated pull-down termination according to an embodiment of the invention. The illustrated split ODT includes two resistive blocks 1601 and 1603 under separate control from the control signal $D_{CNTL}(T_1)$ and $D_{CNTL}(T_2)$, respectively, for each leg of the differential receiver 1600.

Figure 17:
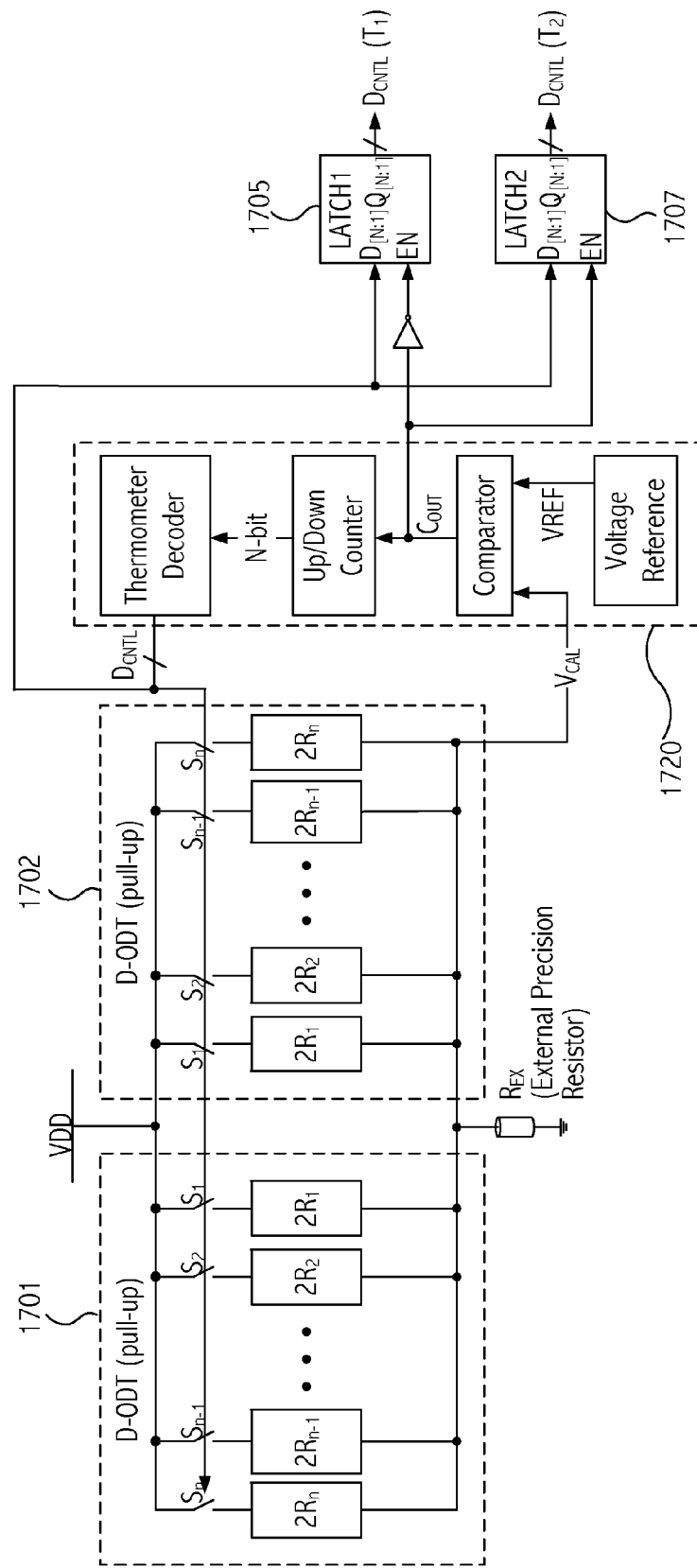
FIG. 17 illustrates an exemplary calibration block diagram for split pull-up D-ODT blocks used for calibration.

FIG. 17 illustrates an exemplary calibration block diagram for split pull-up D-ODT blocks used for calibration. Two D-ODT blocks 1701 and 1702 are used in parallel and have the equivalent resistance to the ODT block 905 in FIG. 9. $D_{CNTL}$ controls both D-ODT blocks 1701 and 1702. The separate control signals $D_{CNTL}(T_1)$ and $D_{CNTL}(T_2)$ stored in the storage location (e.g., latches) 1705 and 1707 control two D-ODT blocks for pull-up or pull-down functionality. The use of $D_{CNTL}(T_1)$ and $D_{CNTL}(T_2)$ provides increased accuracy and less toggling. Note that while $D_{CNTL}$ continues to toggle between $D_{CNTL}(T_1)$ and $D_{CNTL}(T_2)$, $D_{CNTL}(T_1)$ and $D_{CNTL}(T_2)$ stay substantially constant. Some toggling may occur for $D_{CNTL}(T_1)$ and $D_{CNTL}(T_2)$ as the calibration circuit adjusts the control values for changes in temperature or other conditions.

Figure 18:
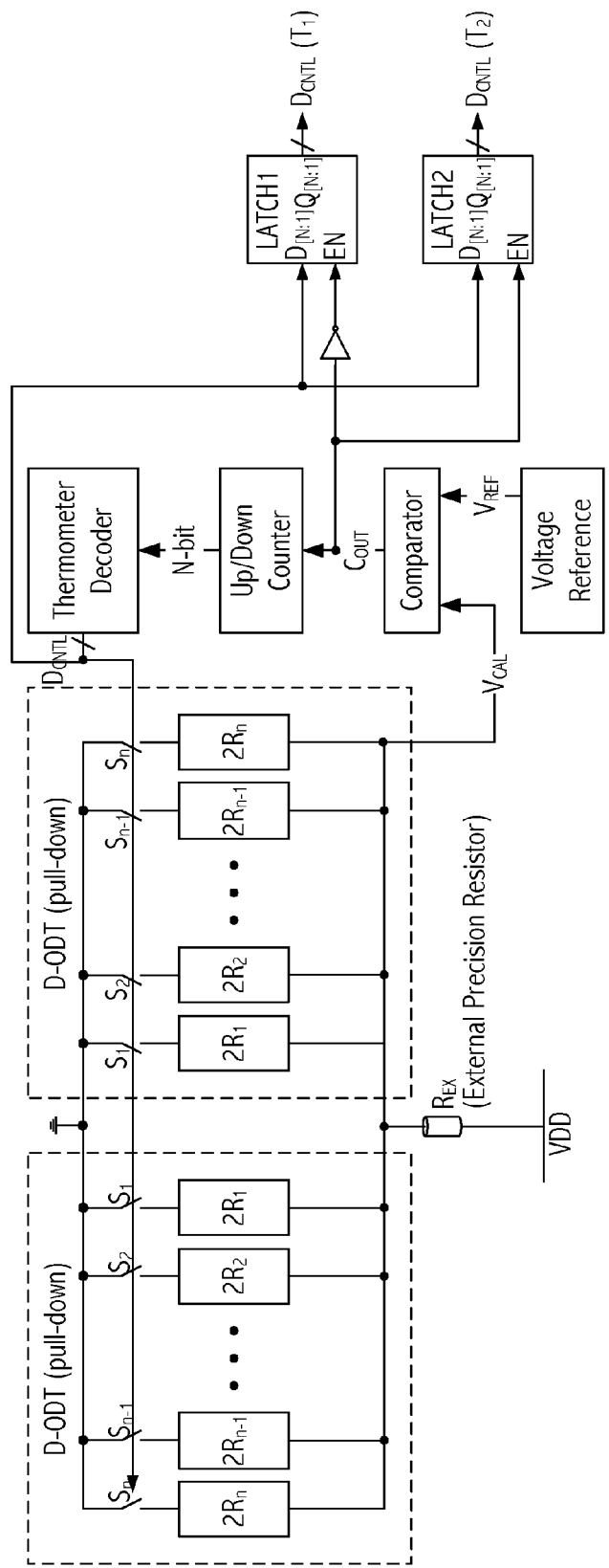
FIG. 18 illustrates an exemplary calibration block diagram for split pull-down D-ODT blocks.

FIG. 18 illustrates an exemplary calibration block diagram for split pull-down D-ODT blocks. Note the presence of ground at the top of the resistor blocks and VDD connected to the external precision resistor $R_{EX}$.

Figure 19:
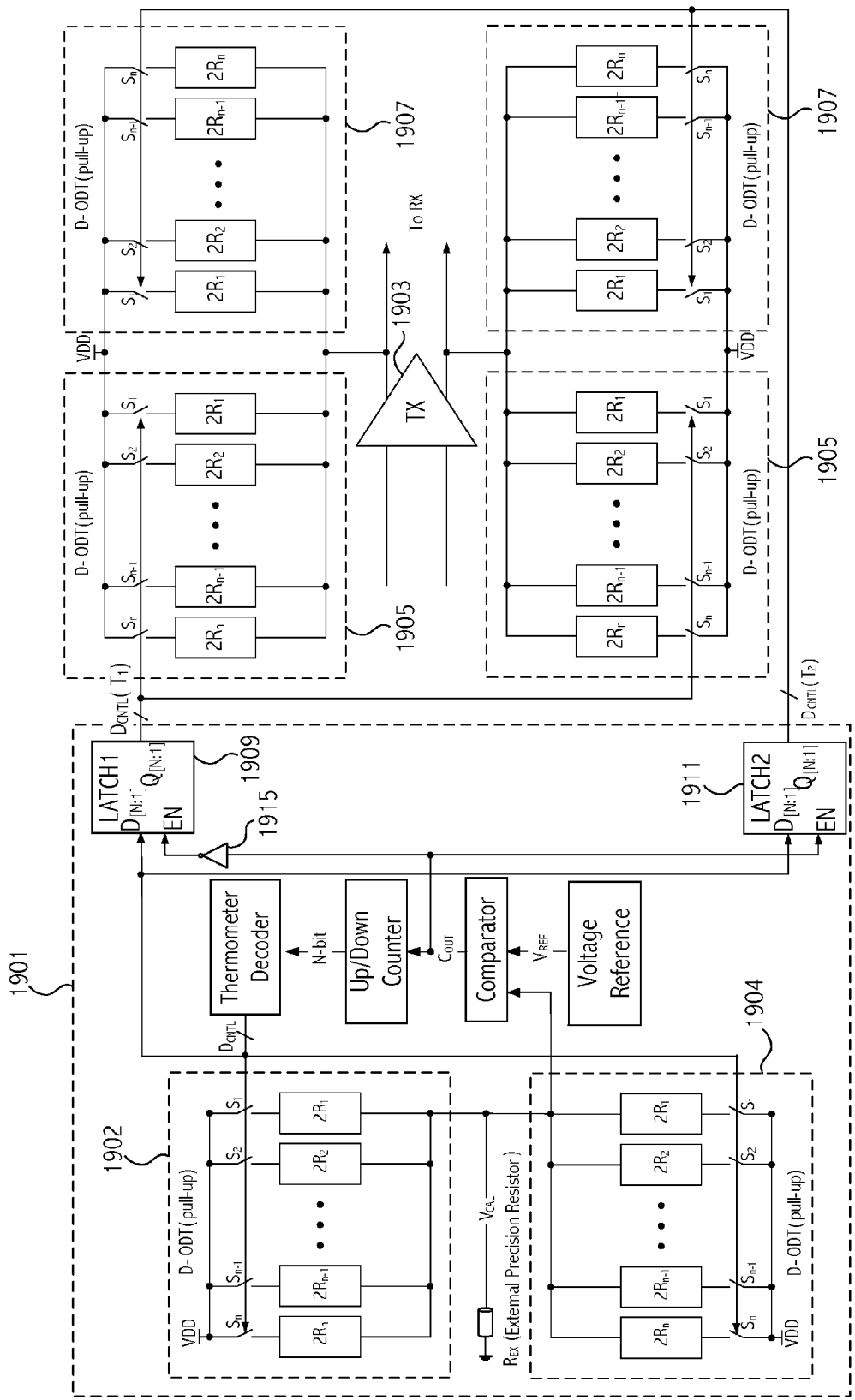
FIG. 19 illustrates a block diagram of an exemplary embodiment of a transmitter pull-up embodiment showing both a calibration block and transmitter with pull-up D-ODT blocks.

FIG. 19 illustrates a block diagram of an exemplary embodiment of a transmitter pull-up embodiment showing both a calibration block 1901 and transmitter 1903 with pull-up D-ODT blocks 1905 and 1907. Note that the addition of latches 1909 and 1911 and inverter 1915 allow the improved accuracy of the termination impedance. The calibration block 1901 is a copy of and identical to the ODT blocks 1905 and 1907. Note that the calibration resistance blocks 1902 and 1904 are both controlled by $D_{CNTL}$.

Figure 20:
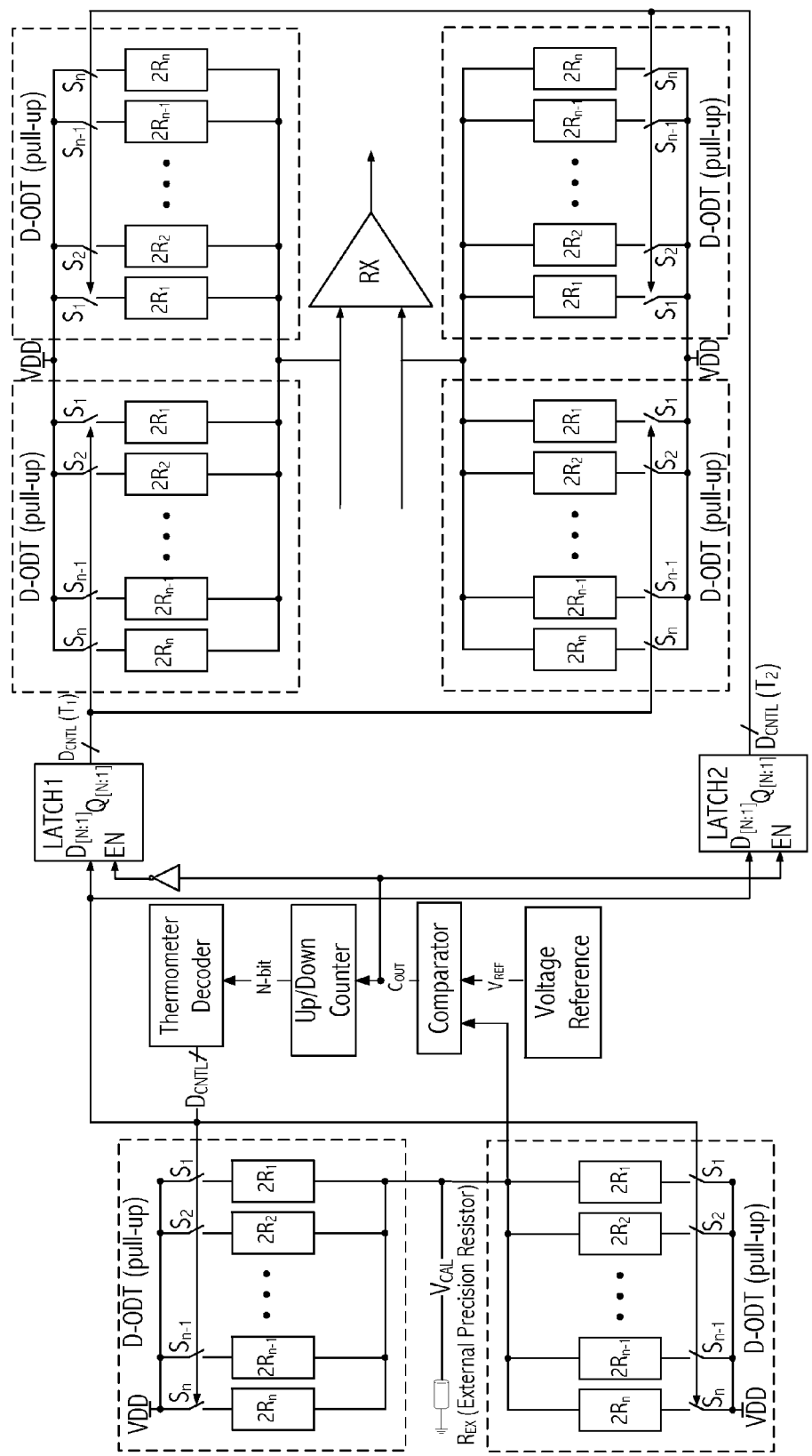
FIG. 20 shows an exemplary block diagram including both calibration block and a receiver with pull-up split D-ODT blocks.

FIG. 20 shows an exemplary block diagram including both calibration block 2001 and a receiver RX 2003 with pull-up split D-ODT blocks.

Figure 21:
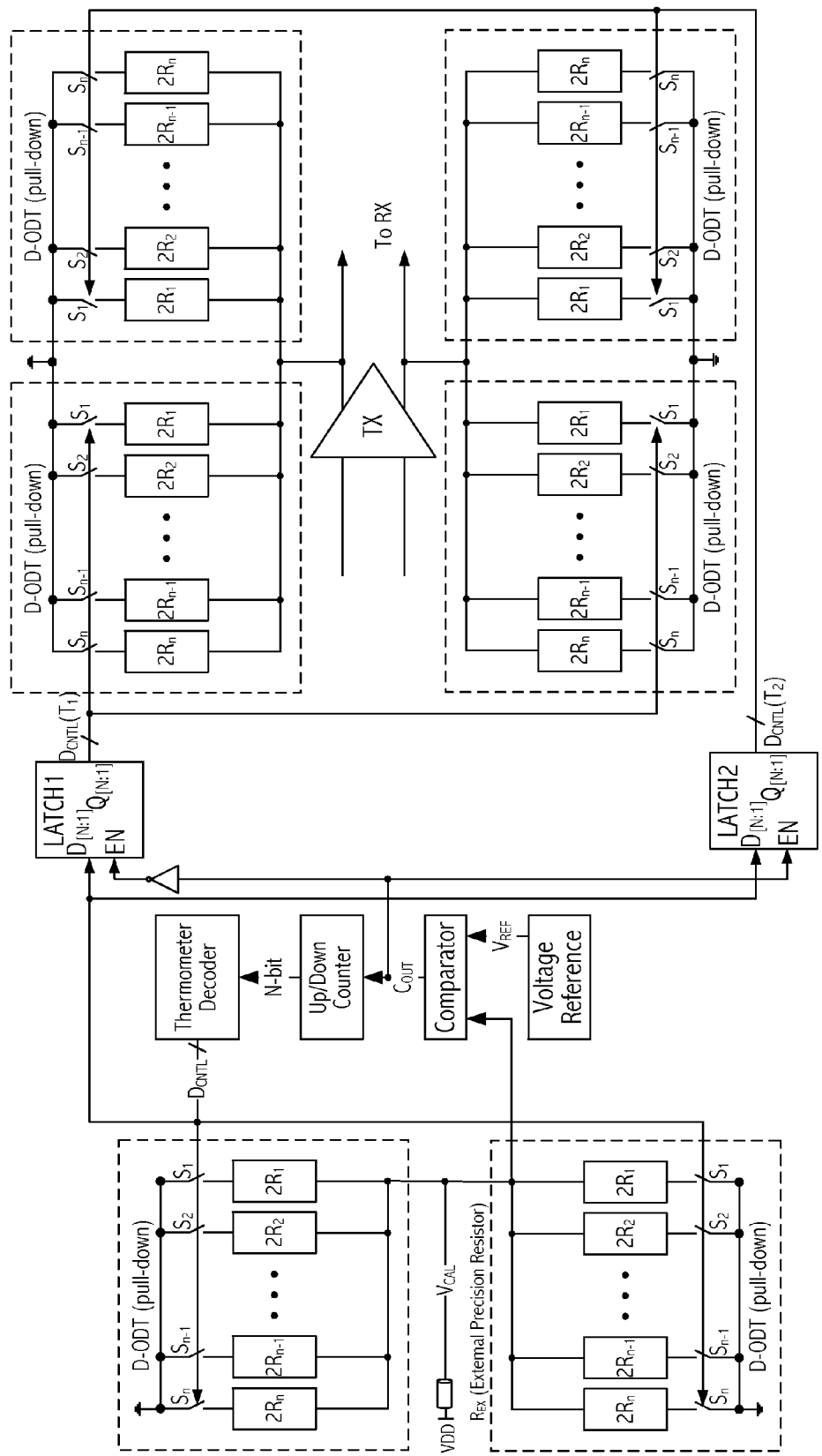
FIG. 21 illustrates an exemplary block diagram of an embodiment that includes both calibration and pull-down D-ODT blocks for a transmitter.
Figure 22:
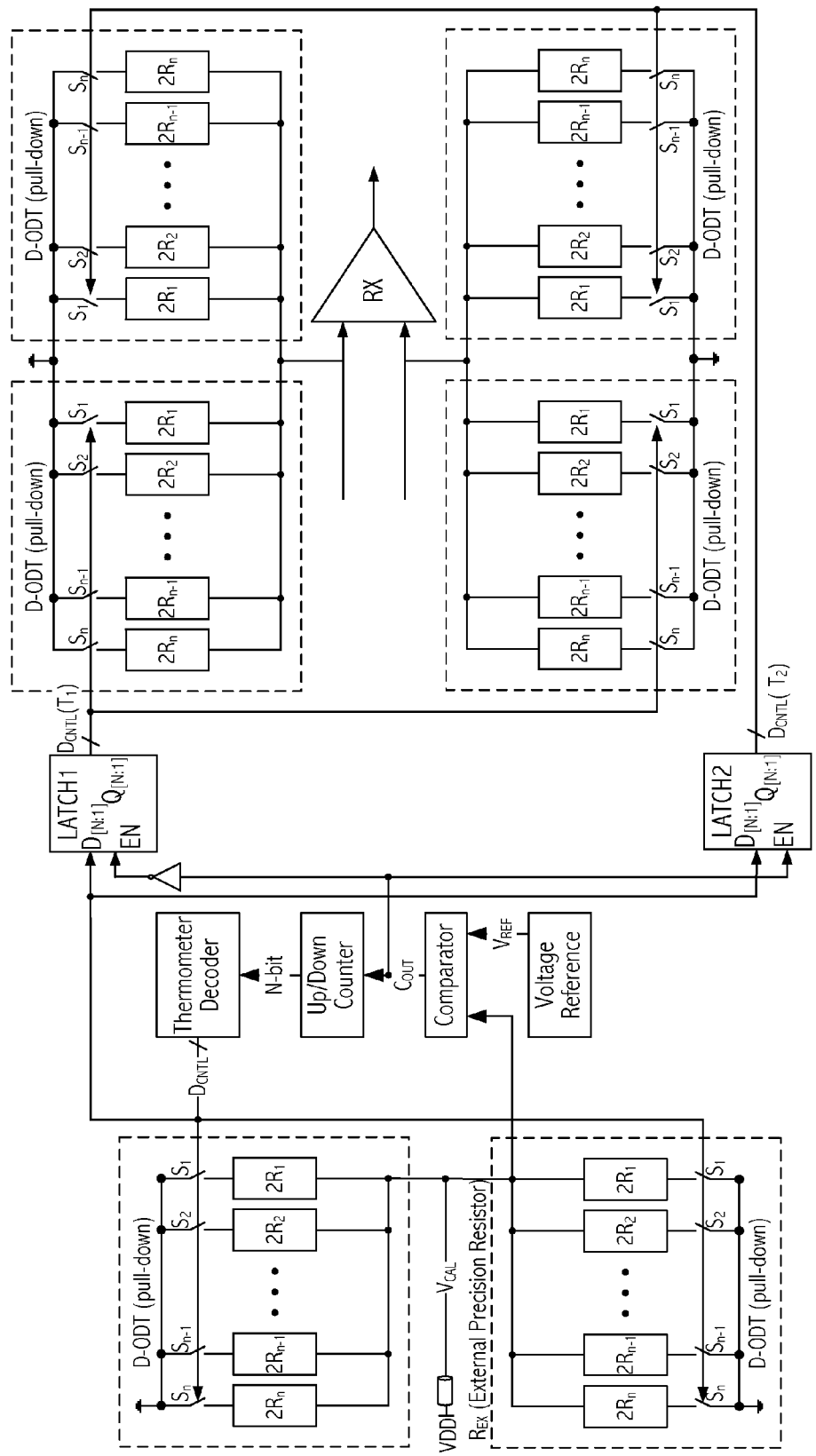
FIG. 22 illustrates an exemplary block diagram of an embodiment that includes both calibration and pull-down D-ODT blocks for a receiver.

FIGS. 21 and 22 illustrate exemplary block diagrams that include both calibration and pull-down D-ODT blocks for a transmitter and receiver, respectively.

Figure 23A:
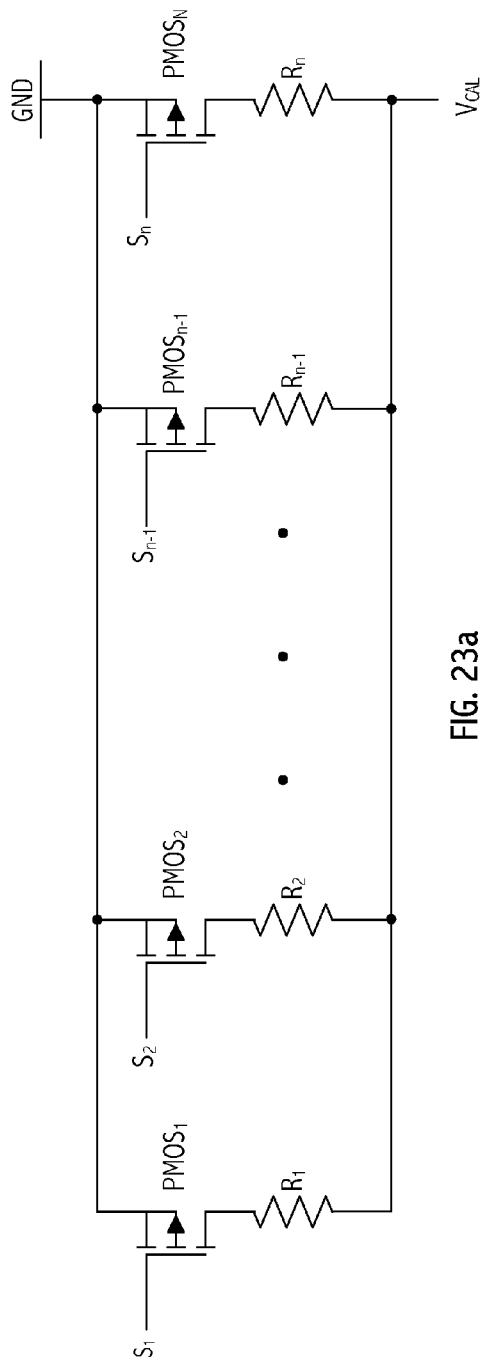
FIG. 23(a) shows an exemplary implementation of switch and resistive components for pull-up termination.
Figure 23B:
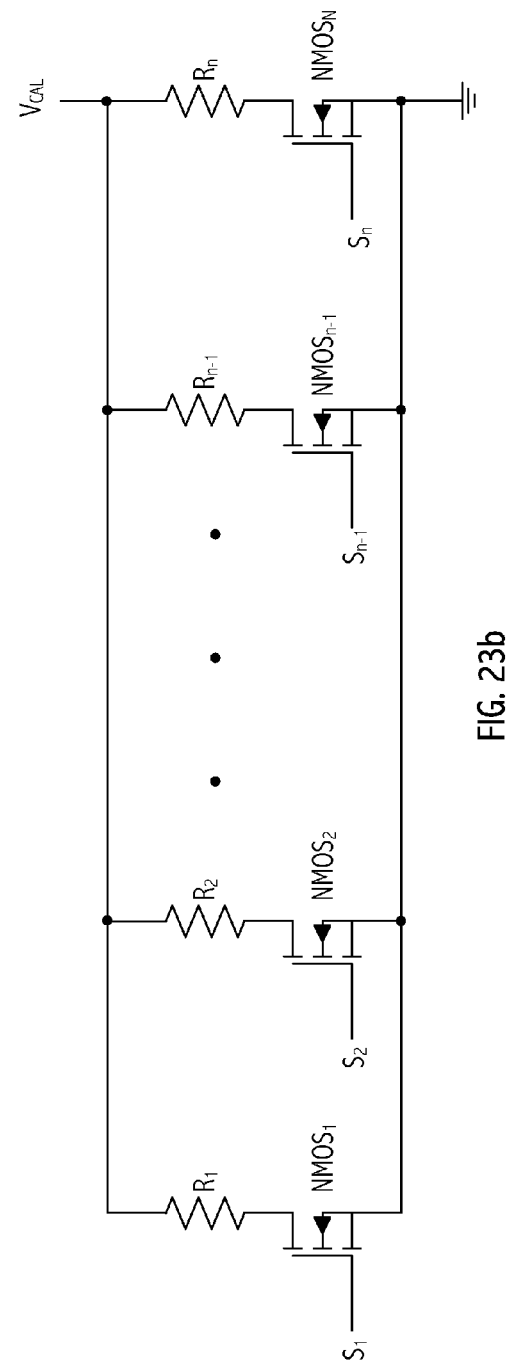
FIG. 23(b) show exemplary implementations of switch and resistive components for pull-down termination.

FIGS. 23(a) and (b) show an exemplary implementation of switch and resistive components for pull-up and pull-down termination, respectively. In the illustrated embodiment, the MOS switch may function not only as a switch but also as a resistor by operating in the linear or triode region. The resistors are typically implemented with passive components such as a poly-resistor, well-resistor or diffusion-resistor. If the MOS switch is operating in the linear region, the total resistance is a combination of MOS resistance and passive component resistance.

Figure 24:
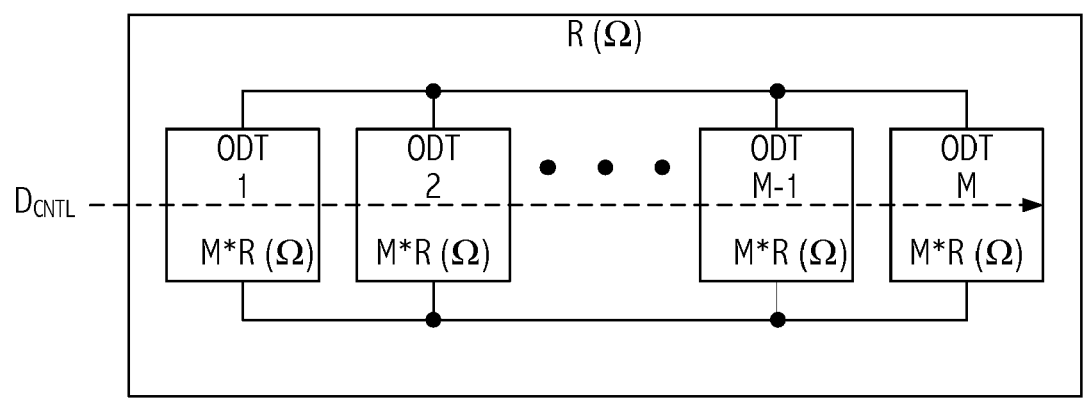
FIG. 24 shows an example of multiple ODT blocks.

In another embodiment, multiple ODT resistances are used in parallel to achieve the desired impedance. FIG. 24 shows an example of multiple ODT blocks. In order to have a resistance of R (Ω), multiple M ODT blocks are used in parallel. Each ODT block has a resistance of M*R (Ω) and $D_{CNTL}$ controls each ODT at the same time. Because the total number of ODT blocks is M and each ODT has a resistance of M*R (Ω), the total resistance of multiple ODT blocks is R (Ω). Note that M is an even number. Note that in certain embodiments, each ODT block may in fact be a single resistance value with a single associated switch.

Figure 25:
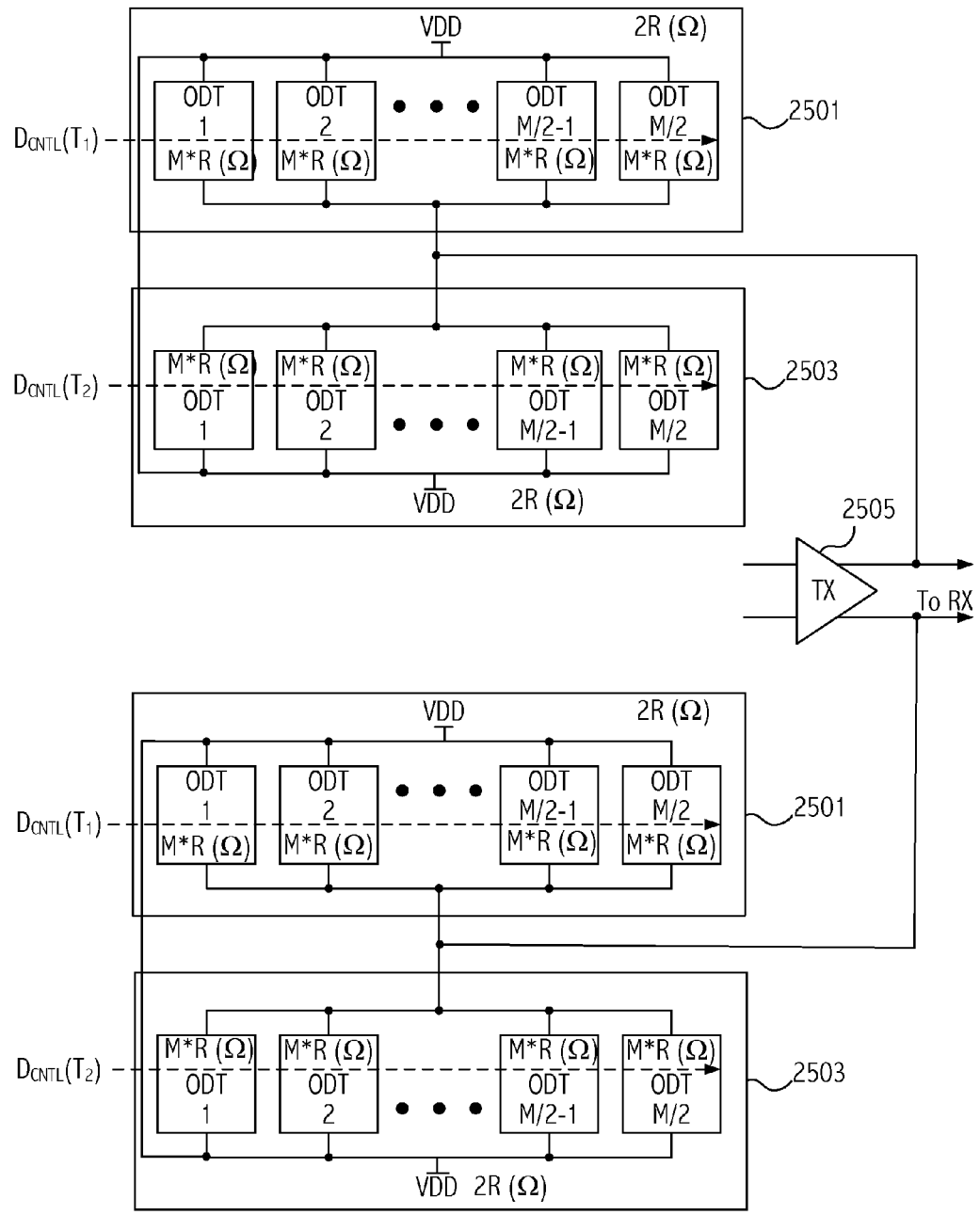
FIG. 25 illustrates an embodiment using multiple ODT blocks for termination of a transmitter or receiver.

FIG. 25 illustrates an embodiment for multiple ODT blocks for termination of a transmitter or receiver. In the embodiment illustrated in FIG. 25, the total number of ODT resistances is M, which is an even number. Remember that the total resistance of M identical resistors in parallel, each having a resistance M*R (Ω), is the resistor value R. Note that each ODT resistance block may be formed of a single resistor or multiple resistors and associated single or multiple switches. The ODT resistances are divided into two groups 2501 and 2503. Note that identical ODT blocks are provided for each leg of the differential transmitter 2505. The total resistance of each group is now 2R instead of R because of the division (since M is now M/2). In order to average impedance, one half of the multiple ODT blocks (group 2501) are controlled by $D_{CNTL}(T_1)$ while the other half of the multiple ODT blocks (group 2503) is controlled by $D_{CNTL}(T_2)$. Note that the doubling of resistance values found in FIG. 9 is not required and thus may be easier to implement. All that is required is that the resistances are divided into two equal groups and one of the groups is controlled by $D_{CNTL}(T_1)$ and one by $D_{CNTL}(T_2)$.

Various embodiments of the invention provide advantages over prior approaches. Higher accuracy can be obtained as compared to previous approaches by averaging separately controlled impedances with adjacent control codes. In other embodiments, a fewer number of bits of a thermometer decoder can achieve the equivalent accuracy of earlier designs. That can lead to a smaller ODT area due to the reduction of switches and resistive components in the ODT blocks.

Additionally, embodiments of the invention avoid impedance toggling during the real time calibration. The purpose of the toggled impedance in the previous design is the implementation of real time calibration against the variation in PVT (process, voltage and temperature). But, the drawback of such an approach is that toggled impedance in time domain may cause a glitch or reflection in transferring or receiving signals because it may be able to induce a different bias current and impedance in TX or RX when the impedance resolution is not fine enough. So it is important to guarantee a good resolution in earlier approaches. But embodiments of the invention do not have toggled impedance during real time calibration by virtue of impedance averaging of the split ODT blocks. There is no glitch and reflection in the embodiments of the invention once calibration is done.

Note that implementing certain embodiments of the invention can be efficient with respect to changes to previous designs because the modifications to previous designs can be relatively small and yet still achieve greater accuracy by splitting the termination resistance in half, adding sufficient control logic to generate two adjacent control signals for the adjacent latches and supplying those control signal to appropriate ones of the switches.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A method for providing a calibrated termination impedance comprising:
   determining first control signals by setting a calibration block to have a resistance above a target impedance value for the termination impedance and determining second control signals by setting the calibration block to have a resistance below the target impedance value; and
   supplying the first and second control signals having different values to configure respectively, first and second switch arrays and thereby associated first and second resistor arrays coupled in parallel, each of the resistor arrays having respective resistance values determined by configuration of the switch arrays, the first control signals causing the first resistor array to have a first resistance value and the second control signals causing the second resistor array to have a second resistance value different than the first resistance value.

2. The method as recited in claim 1 wherein the first and second control signals are adjacent codes.

3. The method as recited in claim 1 wherein the first and second resistor arrays are substantially identical and the first and second switch arrays are substantially identical.

4. The method as recited in claim 1 wherein:
   the first resistor array and second resistor array are coupled between a first power supply node and a transmission node.

5. The method as recited in claim 1 further comprising calibrating the termination impedance by comparing a first representation of the target impedance value to a second representation of a resistance formed by third and fourth resistor arrays substantially identical to the first and second resistor arrays, the third and fourth resistive loads being part of the calibration block.

6. The method as recited in claim 5 further comprising:
   comparing as the first representation a reference voltage to a second voltage as the second representation, and generating a comparator output signal, the second voltage based on current through the third and fourth resistive loads;

counting up or down according to the comparator output signal and supplying a counter output signal; and decoding the counter output and supplying the decoder output as third control signals to configure third and fourth switch arrays associated respectively with the third and fourth resistor arrays.

7. The method as recited in claim 6 further comprising:

storing in a first plurality of storage elements the decoder output when the comparator output signal is at a first value and storing the decoder output in a second plurality of latches when the decoder output is at a second value; and supplying the first and second control signals, respectively, from the first and second plurality of storage elements.

8. The method as recited in claim 7 wherein one of the first and second control signals is generated based on the counter output signal responsive to an increment of the counter and the other of the first and second control signals is generated responsive to a decrement of the counter.

9. The method as recited in claim 7 further comprising supplying a thermometer encoding of the counter output signal as the third control signals.

10. The method as recited in claim 7 further comprising:

configuring a fifth resistor array coupled between the first power supply node and a second transmission node by configuring a fifth plurality of switches associated with the fifth resistor array according to the first control signals; and configuring a sixth resistor array coupled between the first power supply node and the second transmission node by configuring a sixth plurality of switches associated with the sixth resistor array according to the second control signals.

11. The method as recited in claim 10 wherein resistance values of the first and fifth resistor arrays when configured are substantially identical and the resistance values of the second and sixth resistive resistor arrays when configured are substantially identical.

12. A non-transitory computer-readable medium storing a computer readable representation of an integrated circuit, the computer readable representation comprising:

a first plurality and second plurality of resistors selectively coupled in parallel between a first power supply node and a transmission node to form an on-die termination resistance;

a first plurality and second plurality of switches coupled between the power supply node and the transmission node to selectively form a first resistance from the first plurality of resistors and a second resistance from the second plurality of resistors;

a calibration block configured to determine first control signals by setting calibration resistors of the calibration block to have a resistance value above a target impedance value for the on-die termination resistance and to determine second control signals by setting the calibration resistors of the calibration block to have a resistance value below the target impedance value; and the calibration block including a control circuit to supply the first control signals to the first plurality of switches to select the first resistance and to supply the second control signals to the second plurality of switches to select the second resistance, wherein the first and second plurality of resistors are substantially identical and the first and second plurality of switches are substantially identical.

13. An apparatus for on-die termination resistance comprising:

a first plurality and a second plurality of resistors selectively coupled in parallel between a first power supply node and a transmission node;

a first plurality and second plurality of switches coupled between the first power supply node and the transmission node, the first plurality of switches to selectively form a first resistance from the first plurality of resistors and the second plurality of switches to selectively form a second resistance from the second plurality of resistors, the combination of the first and second resistances forming a third resistance providing the on-die termination resistance; and a calibration block including a control circuit to supply first control signals to the first plurality of switches to select the first resistance and to supply second control signals to the second plurality of switches to form the second resistance, wherein the first and second control signals are selected to set the first and second resistances to different values; and wherein the control circuit is further configured to determine the first control signals by setting a configurable resistance of the calibration block to have a resistance value above a target impedance value for the on-die termination resistance and to determine the second control signals by setting the configurable resistance to have a resistance value below the target impedance value.

14. The apparatus as recited in claim 13 further comprising:

third and fourth plurality of resistors selectively coupled in parallel between the first power supply node and another node;

third and fourth plurality of switches coupled between the power supply node and the other node, the third plurality of switches to selectively form a third resistance from the third plurality of resistors and the fourth plurality of switches to selectively form a fourth resistance from the fourth plurality of resistors, the third and fourth switches configured according to third control signals from which the first and second control signals are generated, the third and fourth resistances in parallel forming a fifth resistance used by the calibration block.

15. The apparatus as recited in claim 14 wherein the control circuit comprises:

a comparator to compare a first representation of the fifth resistance to a representation of the target impedance and to supply a comparator output signal;

a counter responsive to count up or down according to the comparator output signal and supply a counter output;

a decoder coupled to the counter to supply the third control signals based on the counter output; and first storage elements and second storage elements coupled to the decoder and to respectfully supply the first and second control signals, the first and second storage elements configured to store different values of the decoder output at different times.

16. The apparatus as recited in claim 15 wherein first enable inputs on the first storage elements are coupled to the comparator output signal, and second enable inputs on the second storage elements are coupled to an inverted version of the comparator output signal.

17. The apparatus as recited in claim 15 wherein the decoder is a thermometer decoder supplying as the third control signals a thermometer encoding of the counter output.

18. The apparatus as recited in claim 15 wherein one of the first and second control signals is generated based on a first value of the counter output following a most recent increment of the counter and the other of the first and second control signals is generated based on a second value of the counter output following a most recent decrement of the counter.

19. The apparatus as recited in claim 13 further comprising:
- a fifth and sixth plurality of resistors selectively coupled in parallel between the first power supply node and a second transmission node;
- a fifth and sixth plurality of switches coupled between the power supply node and the second transmission node, the fifth plurality of switches to selectively form a fifth resistance from the fifth plurality of resistors and the sixth plurality of switches to selectively form a sixth resistance from the sixth plurality of resistors;
- wherein the fifth plurality of switches are coupled to the first control signals to select the fifth resistance and the sixth plurality of switches are coupled to the second control signals to select the sixth resistance; and
- wherein the first and fifth resistances are substantially identical and the second and sixth resistances are substantially identical.

20. The apparatus as recited in claim 19 wherein the first and second transmission nodes are coupled to one of a differential transmitter and differential receiver on a same integrated circuit as the first, second, third, and fourth plurality of resistors.

21. The apparatus as recited in claim 13 wherein the first power supply node is one of VDD and ground.

22. The apparatus as recited in claim 13 wherein the first the first and second plurality of resistors are substantially identical and the first and second plurality of switches are substantially identical.

23. The apparatus as recited in claim 13 wherein the first and second control signals are adjacent codes causing the configurable resistance to be respectively, above the target impedance value and below the target impedance value.

* * * * *

UNITED STATES PATENT AND TRADEMARK OFFICE
CERTIFICATE OF CORRECTION

PATENT NO. : 8,384,424 B2  
APPLICATION NO. : 13/083264  
DATED : February 26, 2013  
INVENTOR(S) : Junho J. H. Cho Page 1 of 1

It is certified that error appears in the above-identified patent and that said Letters Patent is hereby corrected as shown below:

In the Claims:

Col. 14, line 12, (Claim 22) please delete "the first"

Signed and Sealed this
Twenty-third Day of April, 2013

Teresa Stanek Rea
*Acting Director of the United States Patent and Trademark Office*